(12) United States Patent  
Yoshida et al.

(10) Patent No.: US 7,985,988 B2
(45) Date of Patent: Jul. 26, 2011

(54) SEMICONDUCTOR DEVICE HAVING CIRCUIT BLOCKS IN A SINGLE CRYSTAL LAYER, AND BUMPS ON CERTAIN BLOCKS

(75) Inventors: Takayuki Yoshida, Shiga (JP); Kimihito Kuwabara, Kyoto (JP); Takuma Motofuji, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 836 days.

(21) Appl. No.: 11/898,305

(22) Filed: Sep. 11, 2007

(65) Prior Publication Data

US 2008/0061324 A1 Mar. 13, 2008

(30) Foreign Application Priority Data

Sep. 12, 2006 (JP) ................. 2006-246197

(51) Int. Cl.
*H01L 27/10* (2006.01)
*H01L 23/48* (2006.01)
*H01L 23/52* (2006.01)
*H01L 29/40* (2006.01)

(52) U.S. Cl. ............... 257/202; 257/738; 257/786

(58) Field of Classification Search .......... 257/202–206, 257/734–738, 758–760, 786, E23.02
See application file for complete search history.

(56) References Cited

U.S. PATENT DOCUMENTS

| | | | | |
|---|---|---|---|---|
| 6,963,136 | B2* | 11/2005 | Shinozaki et al. | 257/759 |
| 7,554,209 | B2* | 6/2009 | Satou et al. | 257/786 |
| 7,808,107 | B2* | 10/2010 | Shinozaki et al. | 257/758 |

FOREIGN PATENT DOCUMENTS

| | | |
|---|---|---|
| JP | 52-120776 | 10/1977 |
| JP | 64-15957 | 1/1989 |
| JP | 2006-24853 | 1/2006 |
| JP | 2006-324320 | 11/2006 |

* cited by examiner

*Primary Examiner* — Cuong Q Nguyen
(74) *Attorney, Agent, or Firm* — Steptoe & Johnson LLP

(57) ABSTRACT

A semiconductor device 20 formed on a semiconductor chip substrate 30 has a plurality of circuit blocks made up of circuits each containing at least a metal oxide semiconductor (MOS) transistor 36, the circuit blocks being covered on top with a protective film 41 to protect the circuits. A plurality of bumps 23a, 23b, 23c are formed, at least via the protective film 41, only on circuit blocks whose current-carrying ability and threshold voltage do not satisfy predetermined values and which are in need of performance enhancement. The bumps 23a, 23b, 23c impose stresses on the MOS transistors 36, increasing the mobility of the MOS transistors 36 and thereby improving the performance of the semiconductor device 20.

18 Claims, 12 Drawing Sheets

SEMICONDUCTOR DEVICE HAVING CIRCUIT BLOCKS IN A SINGLE CRYSTAL LAYER, AND BUMPS ON CERTAIN BLOCKS

FIELD OF THE INVENTION

The present invention relates to a semiconductor device suitable for larger packing density and higher speed as well as to a method of manufacturing the semiconductor device.

BACKGROUND OF THE INVENTION

With the advancement of an information society, higher performance is expected from system LSIs which are semiconductor devices indispensable to performance enhancement of mobile terminals, personal computers, digital household appliances, and the like. Means for achieving higher performance includes miniaturization of elements. For example, a processing range of 100 nm or less in terms of gate length is used for MOS transistors.

Miniaturization of MOS transistor gate length can often result in a so-called short-channel effect which increases drain-source leakage current. The short-channel effect can be suppressed if impurity density in a substrate is increased. However, increases in the impurity density in channel layers result in increased impurity scattering and consequently in reduced mobility, which in turn reduces drive current. To solve this problem, it is useful to increase the mobility of carriers moving in the channel layers right under gates and thereby enhance current-carrying ability of the channel layers.

Conventionally, the use of piezoelectric effect which produces mechanical strains in silicon devices is well known as a method for changing electrical conductivity by changing the mobility of the carriers moving in the channel layers. This method is applied mechanically to silicon devices around the end of a wafer manufacturing process of the silicon devices. This is expected to improve device performance.

An example of the application of the method to a silicon device will be described with reference to FIG. 14.

FIG. 14 is a schematic sectional view showing a configuration of a conventional semiconductor device.

As shown in FIG. 14, a semiconductor device 10 includes a semiconductor chip 1 which contains various types of metal oxide semiconductor (MOS) transistors 2 which vary in current-carrying ability and threshold voltage. A bump 6 is formed on each of the MOS transistors 2 which vary in current-carrying ability and threshold voltage via a protective film 3 and fastened to the semiconductor chip 1.

If the MOS transistor 2 is an n-channel (n-type) MOS transistor, if the current-carrying ability of the semiconductor device is lower than a predetermined value, and if the threshold voltage is higher than a predetermined value, the bump is fastened by applying a dynamic pressure 4 from above the MOS transistor 2 to bring the current-carrying ability and threshold voltage to the predetermined values. This makes it possible to change the two characteristics, i.e., increase the current-carrying ability and lower the threshold voltage below the predetermined value. This provides desired electrical characteristics to the MOS transistor, making it possible to control the electrical characteristics of the MOS transistor, i.e., the current-carrying ability and threshold voltage of the MOS transistor. Also, since changes in the pressure 4 or tension 5 applied to the MOS transistor 2, i.e., changes in an absolute value of the pressure, cause changes to the electrical characteristics, a situation in which the predetermined electrical characteristics are not available can be dealt with by adjusting the pressure 4 or tension 5.

In so doing, it is effective to form the bump 6 above the MOS transistor 2. An advantage of forming the bump 6 is that the bump 6 serves as a sort of push button making it possible to transmit the pressure 4, tension 5, or other force directly to the MOS transistor 2. Consequently, pressure is applied to the MOS transistor 2 from an entire pad rather than from point to point, applying a load uniformly.

There is an example in which characteristics of a semiconductor chip was improved by developing an ingenious structure for a semiconductor package. Specifically, at least one uneven surface was provided among contact surfaces between the semiconductor chip and package to apply stresses on the entire semiconductor chip. Incidentally, as a means of applying stresses on the entire semiconductor chip, gas pressure or liquid pressure is used when enclosing the package with the semiconductor chip mounted.

Furthermore, there is an example in which a high-mobility semiconductor chip was implemented by installing a convex stage in a semiconductor package, mounting the semiconductor chip on the stage, and thereby applying tensile stresses on a main surface of the semiconductor chip.

DISCLOSURE OF THE INVENTION

However, with semiconductor technology in which miniaturization is proceeding rapidly, a vast number of transistors are mounted on a highly integrated semiconductor chip, where the transistors and other circuit elements are grouped into circuit blocks according to their functions, or into circuit sections according to their operation. Consequently, if tensile stresses or compression stresses are applied uniformly to the entire semiconductor chip, some circuit blocks or circuit sections undergo performance degradation or undergo deterioration of reliability due to the tensile stresses or compression stresses. Also, since tensile stresses or compression stresses are applied on some of the circuit blocks or circuit sections, great tensile stresses or compression stresses must be applied externally to the entire semiconductor chip.

The present invention has been made to solve the above problems and has an object to provide a semiconductor device that can enhance performance of circuit blocks or circuit sections whose current-carrying ability and threshold voltage do not satisfy predetermined values and which are in need of performance enhancement as well as to provide a method of manufacturing the semiconductor device.

To achieve the above object, the present invention provides a semiconductor device that has a substrate which contains a single-crystal semiconductor layer at least in a surface layer, and a plurality of circuit blocks constructed in the single-crystal semiconductor layer and made up of circuits containing MOS transistors, the semiconductor device including: a protective film formed on entire top surfaces of the circuit blocks formed in the single-crystal semiconductor layer; and at least one bump formed on each of appropriate ones of the circuit blocks via the protective film, wherein the bump is formed in a position to apply to the MOS transistors stresses which will increase carrier mobility of the MOS transistors which need improvement in electrical characteristics.

Also, the present invention provides a semiconductor device that has a substrate which contains a single-crystal semiconductor layer at least in a surface layer, and a plurality of circuit blocks constructed in the single-crystal semiconductor layer and made up of circuits containing MOS transistors, the semiconductor device including: evaluation circuit sections each placed adjacent to each predetermined one of the circuit blocks and formed of MOS transistors of the same configuration as the MOS transistors of the circuit blocks; a protective film formed on entire top surfaces of the circuit blocks and the evaluation circuit sections formed in the single-crystal semiconductor layer; and at least one bump formed on each of appropriate ones of the circuit blocks via the protective film, wherein the bump is formed in a position to apply to the MOS transistors stresses which will increase carrier mobility of the MOS transistors in the circuit blocks which are determined to be in need of improvement in electrical characteristics based on measurements of electrical characteristics of the respective evaluation circuit sections.

Furthermore, the MOS transistors are n-type MOS transistors.

Furthermore, the MOS transistors are p-type MOS transistors.

Furthermore, the MOS transistors have a CMOS structure.

Furthermore, the single-crystal semiconductor layer is made of a silicon single crystal; and a direction of a current flowing through channel layers of the n-type MOS transistors is one of [100] and [010] directions of the silicon single crystal.

Furthermore, the single-crystal semiconductor layer is made of a silicon single crystal; and a direction of a current flowing through channel layers of the n-type MOS transistors is one of [110] and [−110] directions of the silicon single crystal.

Furthermore, the single-crystal semiconductor layer is made of a silicon single crystal; and a direction of a current flowing through channel layers of the p-type MOS transistors is a [110] direction of the silicon single crystal.

Furthermore, the stresses imposed on channel layers of the n-type MOS transistors from the bump are compression stresses applied from a gate electrode direction.

Furthermore, the stresses imposed on channel layers of the n-type MOS transistors from the bump are tensile stresses applied along a source-drain direction.

Furthermore, the stresses imposed on channel layers of the n-type MOS transistors from the bump are compression stresses applied in a direction orthogonal to a source-drain direction.

Furthermore, the stresses imposed on channel layers of the p-type MOS transistors from the bump are tensile stresses applied along a source-drain direction.

Furthermore, the stresses imposed on channel layers of the p-type MOS transistors from the bump are compression stresses applied in a direction orthogonal to a source-drain direction.

Furthermore, material of the bump has a higher coefficient of thermal expansion than material of the protective film; and the tensile stresses are imposed as the bump is cooled after being placed on the protective film at a high temperature.

Furthermore, material of the bump has a higher coefficient of thermal expansion than material of the protective film; and the tensile stresses are imposed as the bump is cooled after being placed on the protective film at a high temperature.

Furthermore, a recess is provided at a location adjacent to channel layers of the MOS transistors on the protective film and the bump is placed in the recess so that stresses in a compression direction will be imposed on that slope of the recess which is on the side of the channel layer, thereby imposing one of the compression stresses and the tensile stresses.

Furthermore, a recess is provided at a location adjacent to channel layers of the MOS transistors on the protective film and the bump is placed in the recess so that stresses in a compression direction will be imposed on that slope of the recess which is on the side of the channel layers, thereby imposing one of the compression stresses and the tensile stresses.

Furthermore, at least two bumps are placed as the bump in a direction orthogonal to a source-drain direction and across the channel layers of the MOS transistor to which the stresses are applied.

Furthermore, at least two bumps are placed as the bump along a source-drain direction and across the channel layers of the MOS transistor to which the stresses are applied.

Furthermore, the bump is arranged in a straight line in one of a source-drain direction and a direction orthogonal to a source-drain direction of the MOS transistor.

DESCRIPTION OF THE EMBODIMENTS

Figure 1A:
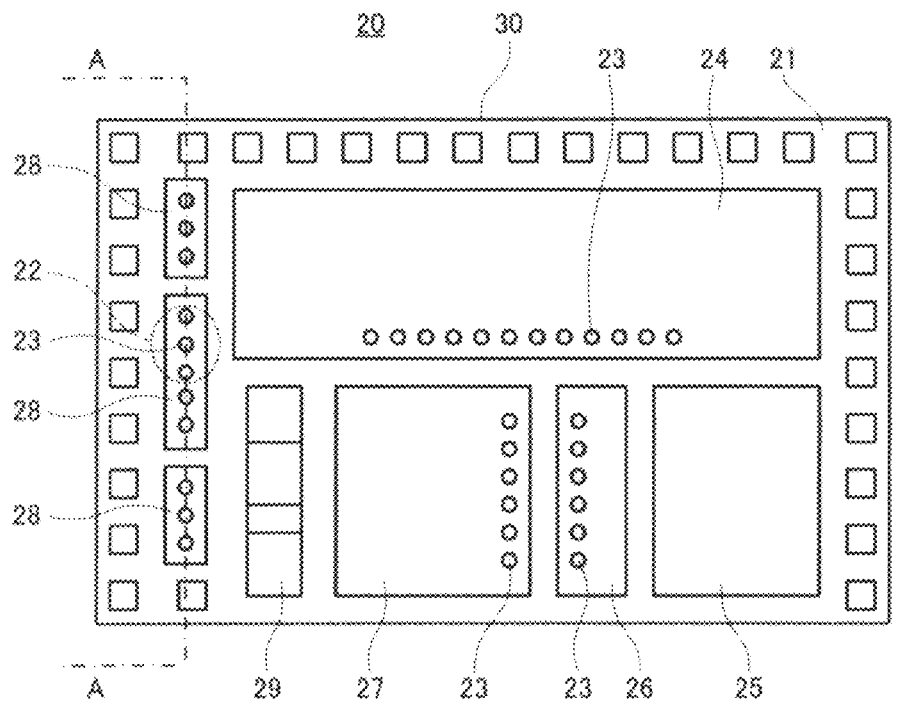
FIG. 1A is a schematic block diagram of a semiconductor device according to a first embodiment of the present invention.

Semiconductor devices according to embodiments of the present invention will be described with reference to the drawings. Incidentally, description of components denoted by the same reference numerals as preceding drawings may be omitted.

First Embodiment

FIGS. 1 to 6 are diagrams showing a first embodiment of the present invention.

Figure 1B:
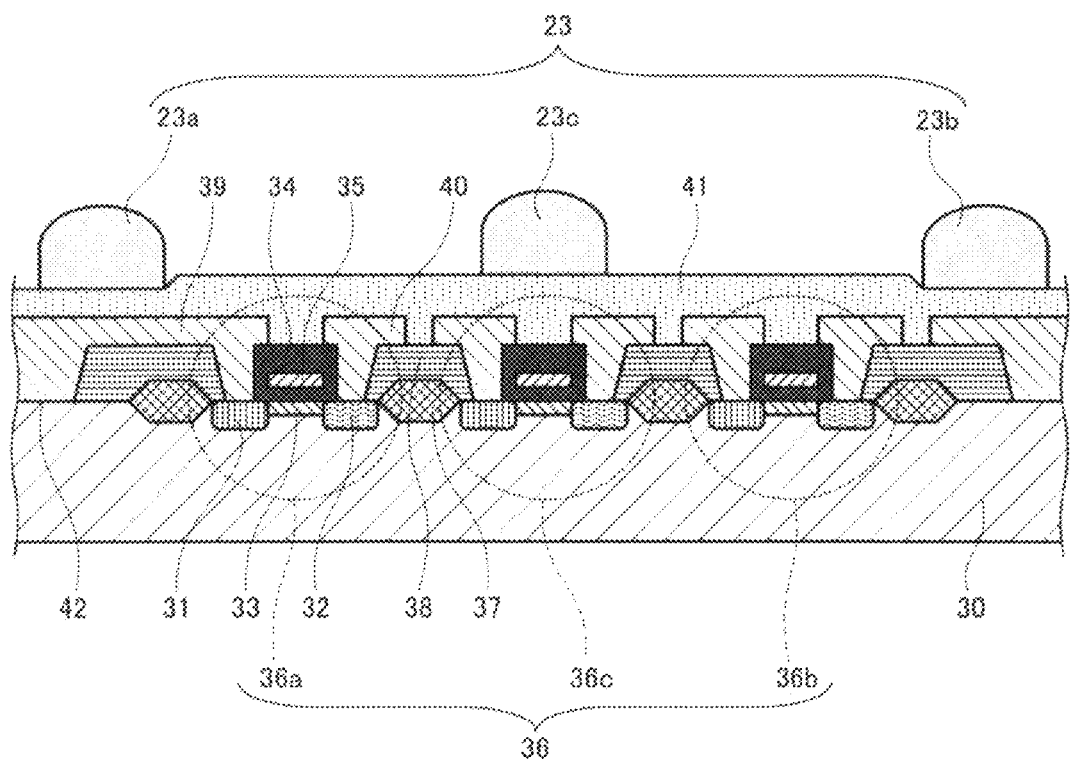
FIG. 1B is a schematic block diagram of the semiconductor device according to the first embodiment of the present invention.
Figure 2A:
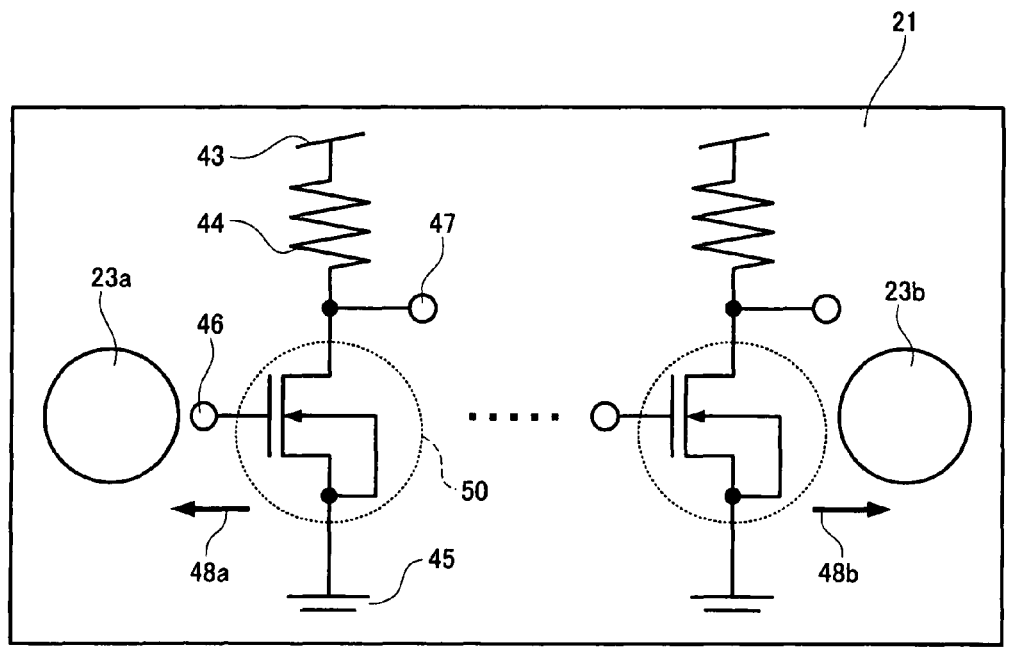
FIG. 2A is a schematic circuit diagram illustrating application of tensile stresses by means of bumps in the semiconductor device according to the first embodiment.
Figure 2B:
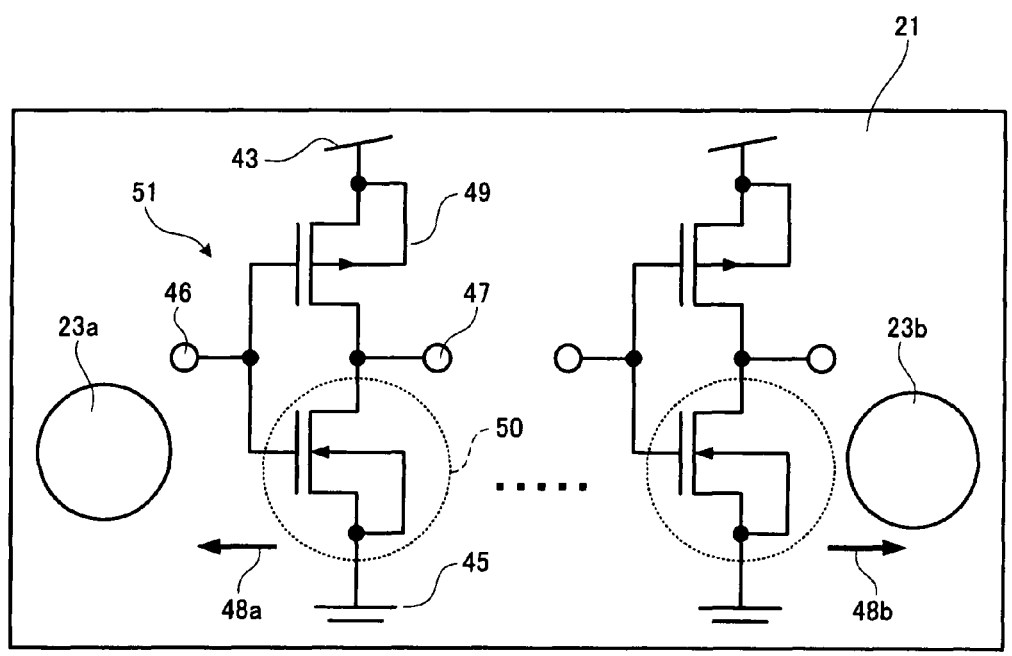
FIG. 2B is a schematic circuit diagram illustrating application of tensile stresses by means of bumps in the semiconductor device according to the first embodiment.
Figure 3:
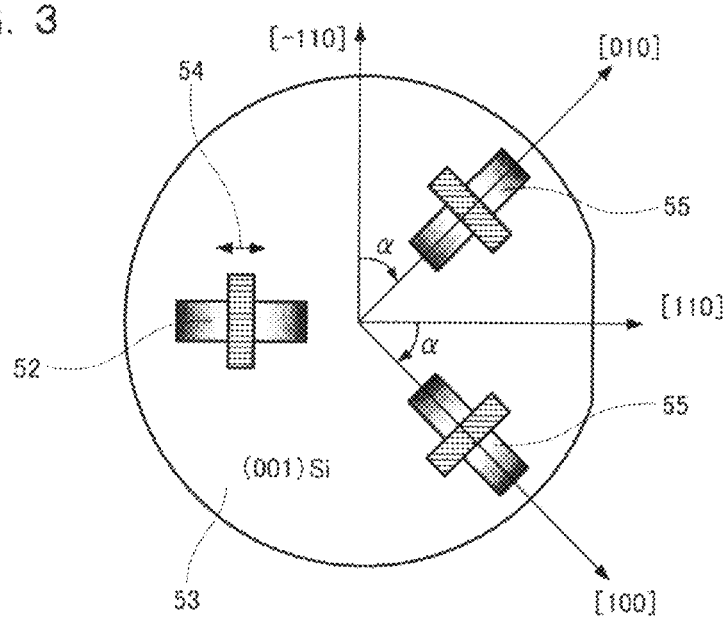
FIG. 3 is a diagram showing a formation direction of a gate of an n-type MOS transistor according to the first embodiment.
Figure 4A:
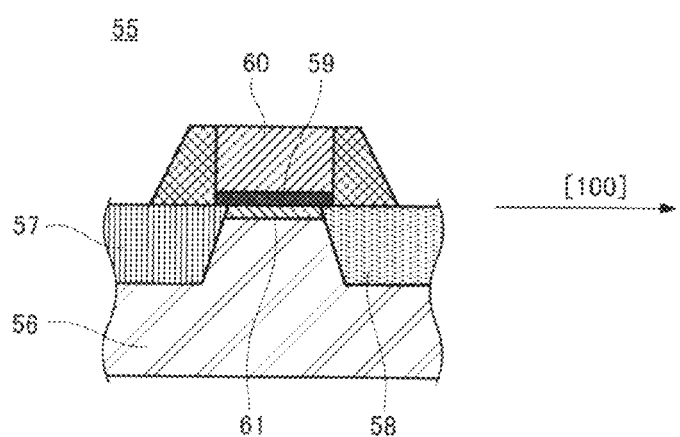
FIG. 4A is a sectional view of a transistor illustrating a relationship between applied stresses and mobility depending on a crystal axis direction.
Figure 4B:
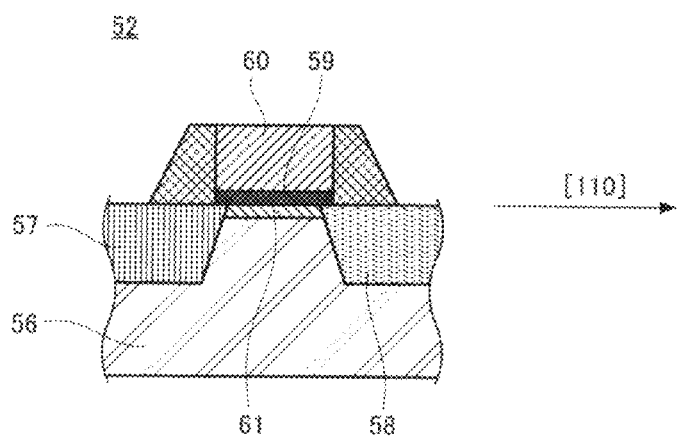
FIG. 4B is a sectional view of the transistor illustrating a relationship between applied stresses and mobility depending on a crystal axis direction.
Figure 5A:
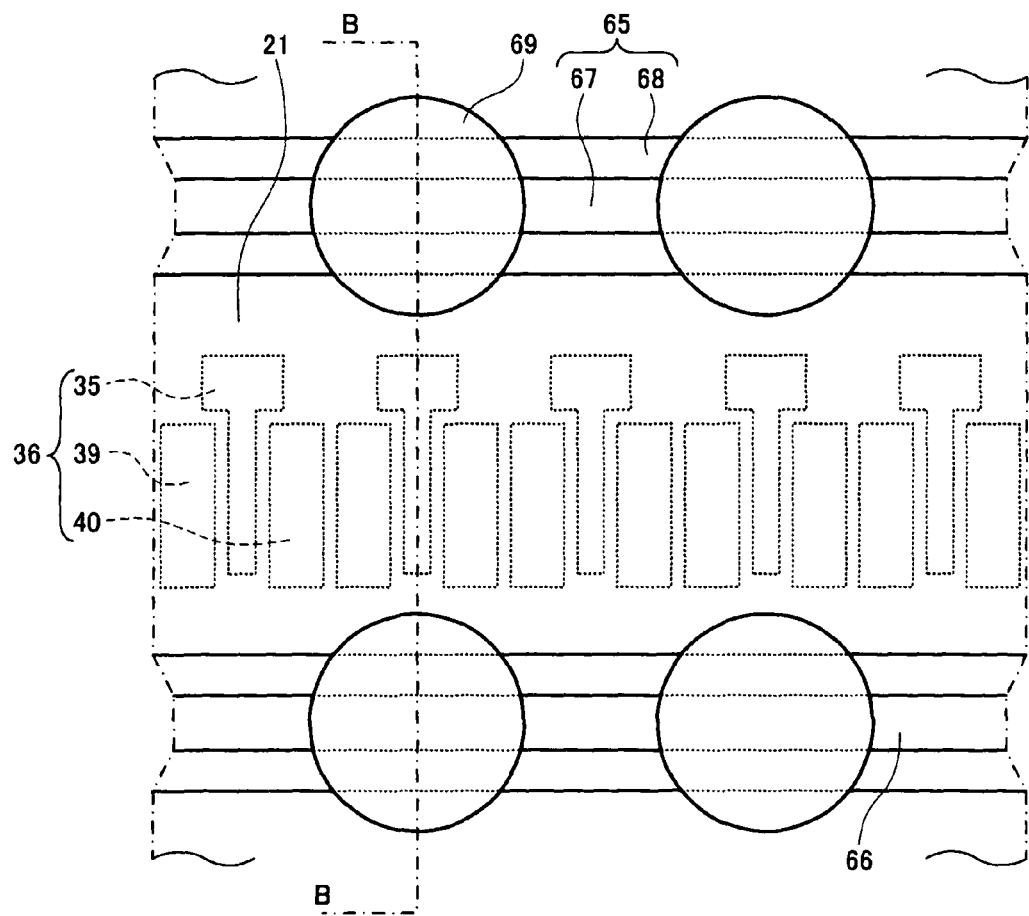
FIG. 5A is a diagram showing a configuration of the semiconductor device according to the first embodiment, with bumps formed in recesses.
Figure 5B:
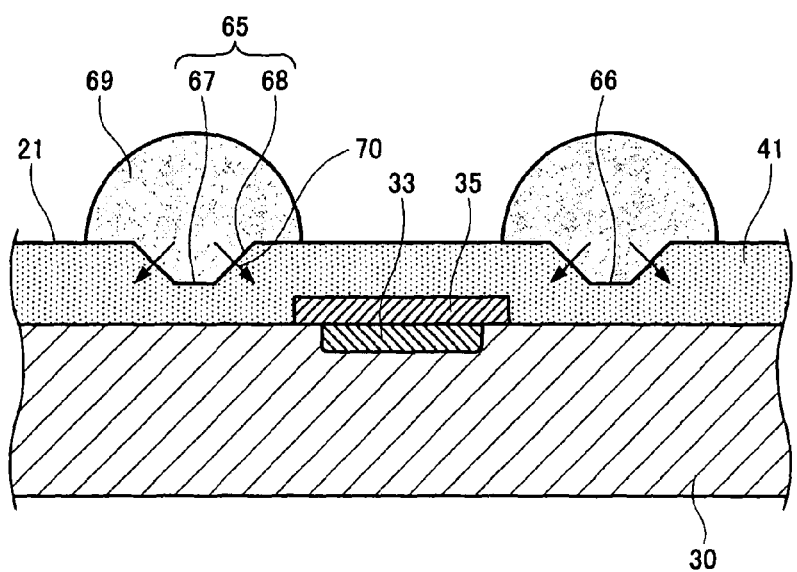
FIG. 5B is a diagram showing the configuration of the semiconductor device according to the first embodiment, with the bumps formed in the recesses.

FIGS. 1A and 1B are schematic block diagrams of a semiconductor device according to the first embodiment of the present invention. FIGS. 2A and 2B are schematic circuit diagrams illustrating application of tensile stresses by means of bumps in the semiconductor device according to the first embodiment. FIG. 3 is a diagram showing a formation direction of a gate of an n-type MOS transistor according to the first embodiment. FIGS. 4A and 4B are sectional views of a transistor illustrating a relationship between applied stresses and mobility depending on a crystal axis direction. FIGS. 5A and 5B are diagrams showing a configuration of the semiconductor device according to the first embodiment, with bumps formed in recesses. FIGS. 6A to 6D are process sectional views showing a manufacturing method of the semiconductor device according to the first embodiment.

Schematic block diagrams of the semiconductor device 20 according to the first embodiment of the present invention are shown in FIG. 1. FIG. 1A is a schematic block diagram of a chip surface in the semiconductor device according to this embodiment as viewed from above. FIG. 1B is a schematic sectional view taken along line A-A in FIG. 1A, showing that area of the semiconductor device which is encircled by a broken line. It is used to illustrate a configuration of a bump.

Referring to FIG. 1A, a plurality of circuit blocks are placed on a chip surface 21 of the semiconductor device 20 such as a system LSI. Main circuit blocks include a memory section 24, an MPU (microprocessor unit) section 25, an input/output control (hereinafter referred to as an IOC) section 26, a programmable logic functional section 27, an input/output circuit section 28, and other circuit sections 29.

The circuit blocks in the semiconductor device 20 formed on a semiconductor chip substrate 30 include circuit sections containing at least a metal oxide semiconductor (MOS) transistor. In FIG. 1A, a plurality of bumps 23 are placed on each of the circuit blocks, i.e., on the memory section 24, IOC section 26, programmable logic functional section 27, and input/output circuit section 28. The plurality of bumps 23 formed on these circuit blocks are used to impose compression stresses from a gate electrode direction and tensile stresses along a source-drain direction on channel layers of n-type MOS transistors in the circuit blocks. Specifically, the bumps 23, which are formed at high temperatures, contract when they cool down, pulling a protective film right under the bumps 23 and thereby imposing tensile stresses along a source-drain direction on the channel layers of the n-type MOS transistors. The application of compression stresses and tensile stresses increases mobility of carriers moving in the channel layers, allowing the n-type MOS transistors to operate at high speed, at high current, or with low current consumption and thereby improving performance of the semiconductor device 20.

Next, main components of the semiconductor device 20 will be described with reference to FIG. 1B.

FIG. 1B is a schematic sectional view taken along line A-A in FIG. 1A, showing that area of the semiconductor device 20 which contains bumps 23 encircled by a broken line 22. Source regions 31 and drain regions 32 which exhibit n-type conductivity are formed, for example, near a surface of the semiconductor chip substrate 30 which exhibits p-type conductivity. Besides n-type channel layers 33 are formed near those areas on the surface of the semiconductor chip substrate 30 which are located between the source regions 31 and drain regions 32. Current flowing through the n-type channel layers 33 is controlled by a voltage applied to gate electrodes 35 via an oxide film 34. In FIG. 1B, three n-type MOS transistors 36 of such a configuration are arranged in parallel: an n-type MOS transistor 36a, n-type MOS transistor 36b, and n-type MOS transistor 36c. The n-type MOS transistors 36 are isolated from adjacent ones by an oxide film 37. Furthermore, the surface of the semiconductor chip substrate 30 is covered with a protective oxide film 38, and source electrodes 39 and drain electrodes 40 are formed in the source regions 31 and drain regions 32, respectively. Incidentally, the source electrodes 39 are grounded by being connected electrically to part 42 of the surface of the semiconductor chip substrate 30. Top of the circuit which contains the n-type MOS transistors 36 formed in this way is covered with a protective film 41 and a bump 23c is placed on that part of the protective film 41 which is located on the gate electrode of the n-type MOS transistor 36c, to impose compression stresses on the n-type MOS transistor 36c from the gate electrode direction.

That is, FIG. 1B shows a substrate, the semiconductor-chip substrate 30 in this case, which has a single-crystal semiconductor layer at least in a surface layer. The single-crystal semiconductor layer contains circuits which include the metal oxide semiconductor (MOS) transistors 36 (n-type MOS transistors, in this case). FIG. 1B shows part of the semiconductor device 20 which has a plurality of circuit blocks containing the circuits and covered on top with the protective film 41 to protect the circuit. A plurality of bumps 23a, 23b, and 23c are formed on each circuit block of the semiconductor device 20 at least via the protective film 41 to impose stresses on the MOS transistors 36, thereby increasing their mobility.

Incidentally, on the protective film 41, the bumps 23a and 23b are placed on the left and right of the n-type MOS transistor 36c in such a way as to sandwich the n-type MOS transistor 36c. Since the bumps 23a and 23b are placed at temperatures higher than room temperature, when they subsequently cool to the room temperature, they contract more greatly than the protective film 41 under them. That is, by placing the bumps 23a and 23b on the left and right and pulling the protective film 41 to the left and right from above, it is possible to apply tensile stresses along the source-drain direction of the n-type MOS transistor 36c. This is because material of the bumps 23a and 23b has a higher coefficient of thermal expansion than material of the protective film 41. After the bumps 23a and 23b are placed on the protective film 41 at higher temperatures than the protective film 41, the bumps 23a and 23b are cooled as their heat escapes to the protective film 41 and the like. Consequently, tensile stresses are imposed on the protective film 41 by the bumps 23a and 23b. The tensile stresses imposed on the protective film 41 are imposed along the source-drain direction of the n-type MOS transistor 36c via the protective film 41. For example, if the bumps 23a and 23b are made of metal material such as Al and the protective film 41 is made of an oxide film such as $SiO_2$ or nitride film such as $Si_3N_4$, since the metal material has higher coefficient of thermal expansion than the oxide or nitride film, the tensile stresses are imposed as described above. Incidentally, the bumps 23a and 23b are preheated before being placed on the protective film 41. Then, they are placed on the semiconductor substrate 30 prepared at room temperature.

Thus, by installing the bumps 23 in appropriate locations on or around the channel layers 33 in circuit blocks or circuit sections whose current-carrying ability and threshold voltage do not satisfy predetermined values and which are in need of performance enhancement, it is possible to impose compression stresses and tensile stresses on the channel layers 33, increasing the mobility of carriers moving in the channel layers 33, thereby allowing the n-type MOS transistors 36 to operate at high speed, at high current, or with low current consumption, and thereby improving the performance of the semiconductor device 20.

As an example, FIG. 2 shows schematic diagrams of circuits which contain n-type MOS transistors formed near the bumps 23a and 23b on the chip surface 21, where FIG. 2A is a schematic diagram of an exemplary circuit in which n-type MOS inverters are formed in parallel and FIG. 2B is a schematic diagram of an exemplary circuit in which CMOS inverters are formed in parallel.

Referring to FIG. 2A, a plurality of n-type MOS inverter circuits are arranged in parallel between the bumps 23a and 23b on the chip surface 21. That is, each of the n-type MOS inverter circuits has a configuration in which the source of an n-type MOS transistor 50 is connected with a load resistor (R) 44, which is connected to a supply voltage (Vdd) 43 at another end. Incidentally, the drain of the n-type MOS transistor 50 is connected to ground 45. Although not shown in FIG. 2A, the source-drain direction of the n-type MOS transistor 50 corresponds to the direction of a line joining the bumps 23a and 23b.

Input signals are inputted through a Vin terminal 46 on the gate side of the n-type MOS transistor 50 and output signals are outputted through a Vout terminal 47 on the source side. The bumps 23a and 23b are placed on the protective film (not shown) on the chip surface 21 as shown in FIG. 2A. They push the protective film from above and thereby pull the protective film between the bumps 23a and 23b, generating tensile stresses. Thus, the tensile stresses are applied in the directions of arrows 48a and 48b shown in FIG. 2A, i.e., along the source-drain direction of the n-type MOS transistor 50. Incidentally, it is alternatively possible to place bumps (not shown) on the protective film right on the n-type MOS transistor 50 and thereby apply compression stresses on the channel layer (not shown) of the n-type MOS transistor 50 from the gate electrode direction.

Similarly, in FIG. 2B, a plurality of CMOS inverter circuits are arranged in parallel between the bumps 23a and 23b on the chip surface 21. That is, each of the CMOS inverter circuits has a configuration in which the source of a p-type MOS transistor 49 is connected to a supply voltage (Vdd) 43 and the drain of the n-type MOS transistor 50 is connected to ground 45. Although not shown in FIG. 2B, the source-drain direction of the n-type MOS transistor 50 corresponds to the direction of a line joining the bumps 23a and 23b.

Input signals are inputted through the Vin terminal 46 on the gate side of the p-type MOS transistor 49 and n-type MOS transistor 50 in a CMOS transistor 51 while output signals are outputted through the Vout terminal 47 which connects the drain of the p-type MOS transistor 49 and source of the n-type MOS transistor 50. The bumps 23a and 23b are placed on the protective film on the chip surface 21 as shown in FIG. 2B. They push the protective film from above and thereby pull the protective film between the bumps 23a and 23b, generating tensile stresses. Thus, the tensile stresses are applied in the directions of arrows 48a and 48b shown in FIG. 2B, i.e., along the source-drain direction of the n-type MOS transistor 50, as in the case of FIG. 2A.

As shown in FIGS. 2A and 2B, by applying tensile stresses in a gate length direction of the n-type MOS transistor 50 in each circuit of each circuit block, it is possible to increase the mobility of the carriers (electrons, in this case) moving in a carrier layer right under the gate electrode, allowing the semiconductor device to operate at high speed, at high current, or with low current consumption. Incidentally, the same effect can be obtained by placing bumps on the protective film right on the n-type MOS transistor and applying compression stresses on the channel layer of the n-type MOS transistor from the gate electrode direction.

FIG. 3 shows a formation direction of the gate of an n-type MOS transistor on a (001) silicon substrate.

Referring to FIG. 3, in order to effectively increase the mobility of the carriers moving in the channel layer of the n-type MOS transistor by applying tensile stresses or compression stresses on a circuit block, it is necessary to build the n-type MOS transistor in such a way that the source-drain direction of the n-type MOS transistor will coincide with the direction of a specific crystal axis. That is, a MOS transistor 52 built along the direction of a conventional crystal axis as shown in FIG. 3 is placed in such a way that a gate length direction 54 which corresponds to the source-drain direction will coincide with a [110] direction or a [−110] direction (hereinafter referred to as a direction of a [110] coordinate system) orthogonal to [110] on a (001) silicon substrate 53. This orientation makes the silicon substrate easily cleavable and workable. Also, the carriers are caused to flow in the [110] or [−110] direction.

However, along with recent miniaturization of semiconductor processes at a level below 100 nm, due to the need to increase current-driving force, consideration is given to a structure in which the gate length direction corresponding to the source-drain direction of MOS transistors 55 coincides with a [100] or [010] direction (hereinafter referred to as a direction of a [100], coordinate system) which is expected to provide higher mobility. Furthermore, application of compression stresses or tensile stresses in the moving direction of the carriers in the channel layer from above a circuit block containing the MOS transistors is expected to give a higher piezoelectric effect and higher mobility than in the conventional direction. Incidentally, an angle α between conventional [−110] and [010] directions is 45 degrees, which is the same as an angle α between the [110] and [100] directions.

FIGS. 4A and 4B are schematic diagrams showing cross-sectional structures of the MOS transistor 55 built along the direction of the conventional crystal axis and MOS transistor 52 built along the direction of a new crystal axis.

In both 4A and 4B, an n-type source region 57 and n-type drain region 58 are formed near a surface of a p-type silicon substrate 56 and a gate electrode 60 is formed on the opposite side of an oxide film 59 from the n-type source region 57 and n-type drain region 58. A voltage applied to the gate electrode 60 controls the quantity of carriers, i.e., current, moving in a channel layer 61. The MOS transistors 55 and 52 differ only in the direction of current flowing through the channel layer 61 and the carriers move with electric fields applied in the [100] (FIG. 4A) and [110] (FIG. 4B) directions, respectively.

Generally, changes in resistivity due to piezoelectric effect resulting from application of stresses can be expressed as follows:

$$\begin{pmatrix} \Delta_{11} \\ \Delta_{22} \\ \Delta_{33} \\ \Delta_{23} \\ \Delta_{31} \\ \Delta_{12} \end{pmatrix} = \begin{pmatrix} \Pi_{11} & \Pi_{12} & \Pi_{12} & 0 & 0 & 0 \\ \Pi_{12} & \Pi_{11} & \Pi_{12} & 0 & 0 & 0 \\ \Pi_{12} & \Pi_{12} & \Pi_{11} & 0 & 0 & 0 \\ 0 & 0 & 0 & \Pi_{44} & 0 & 0 \\ 0 & 0 & 0 & 0 & \Pi_{44} & 0 \\ 0 & 0 & 0 & 0 & 0 & \Pi_{44} \end{pmatrix} \begin{pmatrix} \sigma_{11} \\ \sigma_{12} \\ \sigma_{33} \\ \sigma_{23} \\ \sigma_{31} \\ \delta_{12} \end{pmatrix} \quad \text{[Formula 1]}$$

where $\Delta_{11}$ to $\Delta_{12}$ are second-rank tensors which represent changes in resistivity and $\sigma_{11}$ to $\sigma_{12}$ are second-rank tensors which represent stresses. A fourth-rank tensor quantity which associates the second-rank tensors to each other is a matrix consisting of piezoelectric coefficients $\pi_{11}$, $\pi_{12}$, $\pi_{44}$, and the like which relate the changes in resistivity to the stresses.

By concretely expanding and arranging the determinant in Formula 1, we obtain:

$$\frac{\Delta \rho}{\rho} = \begin{pmatrix} \Pi_{11}\sigma_{21} + \Pi_{12}\sigma_{22} + \Pi_{12}\sigma & \Pi_{44}\sigma_{12} & \Pi_{44}\sigma_{13} \\ \Pi_{44}\sigma_{12} & \Pi_{12}\sigma_{11} + \Pi_{11}\sigma_{22} + \Pi_{12}\sigma_{33} & \Pi_{44}\sigma_{23} \\ \Pi_{44}\sigma_{13} & \Pi_{44}\sigma_{13} & \Pi_{12}\sigma_{11} + \Pi_{12}\sigma_{22} + \Pi_{11}\sigma_{33} \end{pmatrix} \quad \text{[Formula 2]}$$

where ρ is resistivity. By relating the resistivity ρ and the mobility μ of the electrons, which are carriers in the n-type MOS transistor in FIG. 4A, to each other and expanding a resulting formula, we obtain:

$$\frac{\Delta \mu}{\mu} = -\frac{\Delta \rho}{\rho} = -\Pi_{11}\sigma_{11} - \Pi_{12}(\sigma_{22} + \sigma_{33}) - \Pi_{44}(\sigma_{12} + \sigma_{13}) \quad \text{[Formula 3]}$$

By substituting a well-known conventional piezoelectric coefficient (see, for example, C. S. Smith: Phys. Rev. B vol. 94 (1954) p. 42) into Formula 3, we obtain:

$$\frac{\Delta \mu}{\mu} = -\frac{\Delta \rho}{\rho} = \quad \text{[Formula 4]}$$
$$1.02 \times 10^{-9}\sigma_{11} - 5.34 \times 10^{-10}\sigma_{22} - 5.34 \times 10^{-10}\sigma_{33}$$

Similarly, by relating the resistivity ρ and the mobility μ of the electrons, which are carriers in the n-type MOS transistor in FIG. 4B, to each other and expanding a resulting formula, we obtain:

$$\frac{\Delta \mu}{\mu} = \quad \text{[Formula 5]}$$
$$-\frac{\Delta \rho}{\rho} = -\frac{\Pi_{11} + \Pi_{12}}{2}(\sigma_{11} + \sigma_{22}) - \Pi_{44}\frac{\sigma_{11} - \sigma_{22}}{2} - \Pi_{12}\sigma_{33}$$

By substituting a well-known conventional piezoelectric coefficient into Formula 5, we obtain:

$$\frac{\Delta \mu}{\mu} = \quad \text{[Formula 6]}$$
$$-\frac{\Delta \rho}{\rho} = 3.1 \times 10^{-10}\sigma_{11} + 1.8 \times 10^{-11}\sigma_{22} - 5.3 \times 10^{-10}\sigma_{33}$$

The second-rank tensors $\sigma_{11}$, $\sigma_{22}$, and $\sigma_{33}$ in Formulas 1 to 6 represent stresses imposed in the source-drain direction, stresses imposed in a direction orthogonal to the source-drain direction, and stresses in the gate electrode direction imposed perpendicularly on the gate. The tensors $\sigma_{11}$, $\sigma_{22}$, and $\sigma_{33}$ which represent the stresses are orthogonal to one another. The tensors $\sigma_{11}$, $\sigma_{22}$, and $\sigma_{33}$ have a "+" sign when they represent tensile stresses and a "−" sign when they represent compression stresses.

Looking at Formulas 4 and 6 of changes in the mobility of the n-type MOS transistor due to stresses in consideration of the above, Formula 4 corresponds to the [100] coordinate system and Formula 6 corresponds to the [110] coordinate system. It can be seen that in the [100] and [110] coordinate systems, the mobility increases notably when compression stresses are imposed from the gate electrode direction. Also, it can be seen that in the [100] coordinate system, the mobility increases notably when compression stresses are imposed in a direction orthogonal to the source-drain direction. Furthermore, if tensile stresses are imposed in the source-drain direction, the mobility increases notably in the [110] coordinate system and increases two- to three-fold in the [100] coordinate system. In the [010] coordinate system, stresses cause mobility increases in a manner similar to the [100] coordinate system while in the [−110] coordinate system stresses cause mobility increases in a manner similar to the [110] coordinate system.

Thus, if the direction of the current flowing through the channel layer is made to coincide with the direction of the [100] coordinate system of the silicon layer by applying tensile stresses along the source-drain direction of the n-type MOS transistor and compression stresses from the gate electrode direction and along the source-drain direction, it is possible to increase the mobility efficiently and effectively, improving the performance of the semiconductor device. That is, since the mobility is increased and the resistivity is decreased, it is possible to operate the semiconductor device at high speed, at high current, or with low current consumption.

FIG. 5 illustrates an example in which compression stresses are imposed in a direction orthogonal to the source-drain direction of n-type MOS transistors. FIG. 5 is a schematic diagram of a configuration in which the n-type MOS transistors are arranged in the source-drain direction, where the n-type MOS transistors are part of the semiconductor device according to the first embodiment of the present invention.

As shown in FIG. 5A, the n-type MOS transistors 36 each of which has a gate electrode 35, source electrode 39, and drain electrode 40 are arranged on the protective film (not shown) on the chip surface 21.

Furthermore, on the chip surface 21, linear recesses 65 and 66 are formed in parallel on opposite sides of the n-type MOS transistors 36 as shown in FIG. 5A. Each of the recesses 65 and 66 has a bottom face 67 and slopes 68. In some part of the recesses 65 and 66, bumps 69 are placed on opposite sides of the n-type MOS transistors 36 as shown in FIG. 5A.

FIG. 5B is a schematic sectional view showing an area containing the n-type MOS transistor 36 sandwiched by a pair of bumps 69 in the recesses 65 and 66, as viewed from a cross section taken along line B-B in FIG. 5A. In FIG. 5B, the channel layer 33 of the n-type MOS transistor is formed on the semiconductor substrate 30, and the gate electrode 35 is formed on the channel layer 33. The protective film 41 is formed, covering the semiconductor substrate 30 and gate electrode 35. The recesses 65 and 66 are formed on the surface of the protective film 41, and the bumps 69 are mounted in them, imposing compression stresses from above. Consequently, for example, the compression stresses are imposed perpendicularly on the slopes 68 of the recess 65 as indicated by arrows 70, and those components of the compression stresses which are parallel to the chip surface 21 cause compression stresses in the source-drain direction to be applied on the channel layer 33.

That is, the compression stresses are imposed when a pair of bumps are placed on opposite sides of the n-type MOS transistor 36 in a direction orthogonal to the source-drain direction and in close contact with the protective film. The stresses in the direction of compression are imposed on the channel layer when the recesses are installed in the locations of the bumps on the protective film and compression stresses are imposed by means of the bumps on those slopes of the recesses which are located on the side of the channel layers.

FIG. 6 shows a manufacturing method of the semiconductor device 20 according to this embodiment. The semiconductor device includes a plurality of circuit blocks made up of circuits which contain metal oxide semiconductor (MOS) transistors in a single-crystal semiconductor layer contained at least in a surface layer of a substrate. The manufacturing method of the semiconductor device according to this embodiment, an example of which is shown in order in FIGS. 6A to 6D, includes a process for forming the MOS transistors and a process for forming an insulating film on the MOS transistors. Furthermore, the manufacturing method of the semiconductor device according to this embodiment includes a bump forming process for forming a plurality of bumps on a protective film formed on the insulating film, where the bumps impose stresses on the MOS transistors at least via the protective film to increase mobility.

Figure 6A:
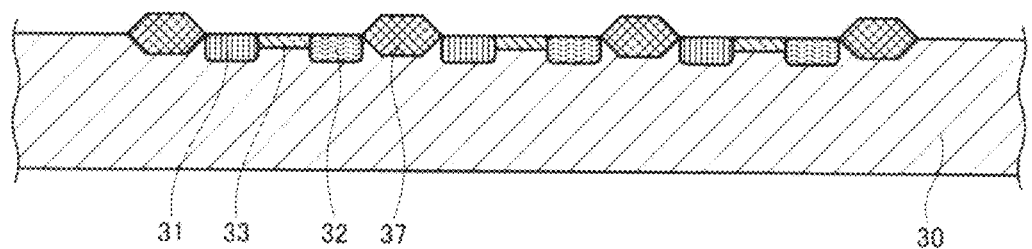
FIG. 6A is a process sectional view showing a manufacturing method of the semiconductor device according to the first embodiment.
Figure 6B:
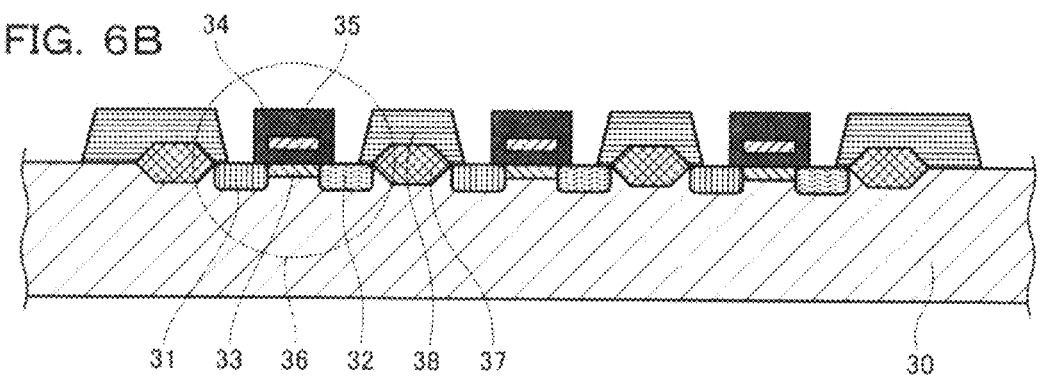
FIG. 6B is a process sectional view showing the manufacturing method of the semiconductor device according to the first embodiment.

Now, the example of the manufacturing method for the semiconductor device according to this embodiment in FIGS. 6A to 6D will be described step by step in detail. FIGS. 6A and 6B show a transistor forming process for forming the MOS transistors.

As shown in FIG. 6A, the n-type source regions 31, n-type drain regions 32, and channel layers 33 are formed, for example, by ion implantation and annealing on the surface of the semiconductor substrate 30 which exhibits p-type conductivity. Furthermore, an oxide film 37 is formed for isolation among the elements of the n-type MOS transistors 36. Next, as shown in FIG. 6B, the protective oxide film 38 which protects the surface of the semiconductor substrate 30, the gate oxide film 34, and the gate electrodes 35 are formed, for example, by CVD for $SiO_2$ film deposition, electrode deposition, lithography and etching, and the like.

Figure 6C:
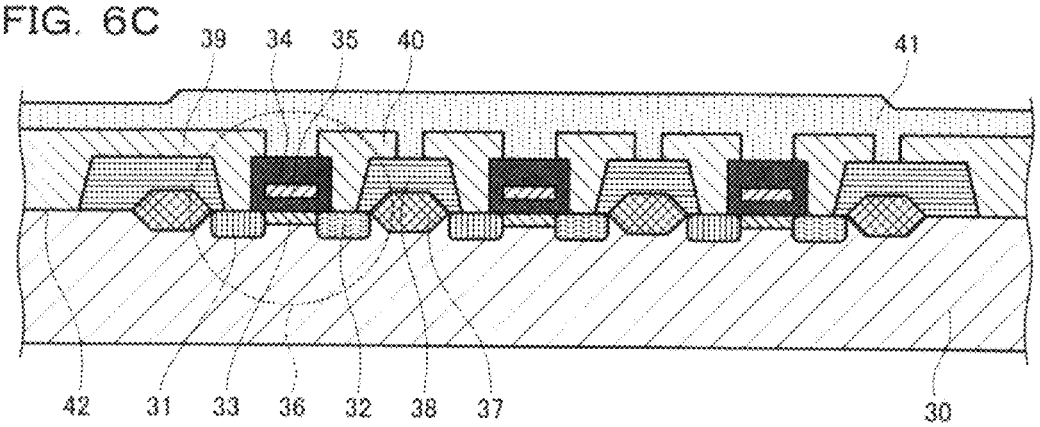
FIG. 6C is a process sectional view showing the manufacturing method of the semiconductor device according to the first embodiment.

In addition, as shown in FIG. 6C, the protective film 41 is formed on the n-type MOS transistors 36, for example, by CVD.

Figure 6D:
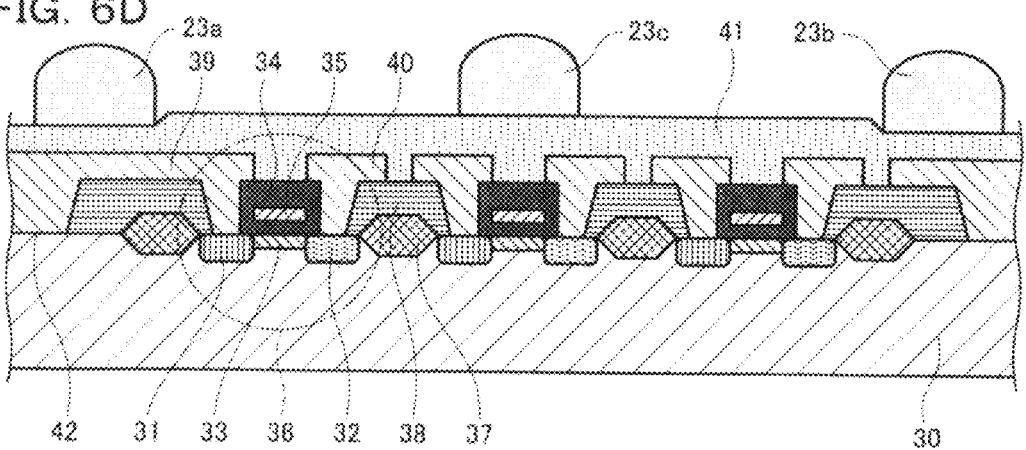
FIG. 6D is a process sectional view showing the manufacturing method of the semiconductor device according to the first embodiment.

Next, as shown in FIG. 6D, the bumps 23a and 23b are formed on the protective film 41, for example, by a wire bonder to impose tensile stresses along the source-drain direction of the n-type MOS transistors 36 in the circuit block. Specifically, the bumps 23a and 23b are formed and installed at high temperatures around 100° C., and thus when they are cooled subsequently, they pull the protective film 41, producing the tensile stresses along the source-drain direction. At the same time, the bump 23c is formed on the protective film 41, for example, by a wire bonder to impose compression stresses on the channel layers 33 from the gate electrode direction right above the gate electrodes. Furthermore, as described with reference to FIG. 5, recesses can be formed in the protective film 41 after the process shown in FIG. 6C and the bumps can be placed in the recesses to impose compression stresses in a direction orthogonal to the source-drain direction.

The semiconductor device 20 is built by the manufacturing method described so far. By installing the bumps in appropriate locations above the gate electrodes or around the circuits of only the circuit blocks or circuit sections which are in need of performance enhancement, it is possible to impose compression stresses and tensile stresses in effective directions on the n-type MOS transistors, increasing the mobility of the carriers moving in the channel layers of the n-type MOS transistors and thereby improving the performance of the semiconductor device 20.

Second Embodiment

A second embodiment of the present invention will be described with reference to FIGS. 7 to 9.

Figure 7A:
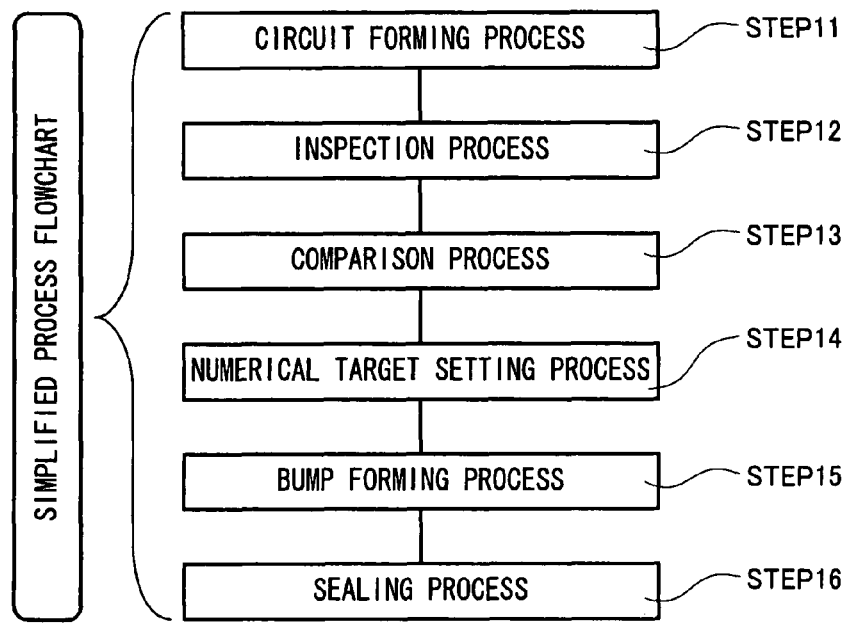
FIG. 7A is a manufacturing process chart of a semiconductor device according to a second embodiment of the present invention.
Figure 7B:
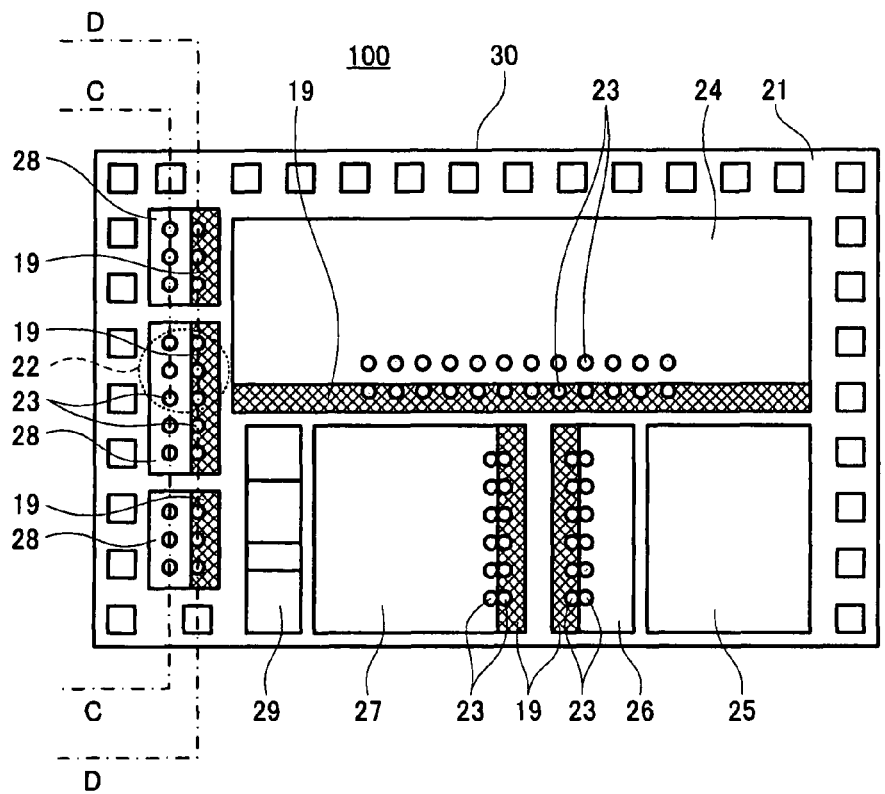
FIG. 7B is a schematic block diagram of the semiconductor device according to the second embodiment of the present invention.

FIGS. 7A and 7B are a manufacturing process chart and schematic block diagram of a semiconductor device according to the second embodiment of the present invention. FIG. 8 is a sectional view showing a configuration of the semiconductor device according to the second embodiment. FIGS. 9A to 9C are diagrams exemplifying a formation position of an evaluation circuit section according to the second embodiment.

FIG. 7A is a simplified process flowchart of a manufacturing method for the semiconductor device according to the second embodiment of the present invention and FIG. 7B is a schematic block diagram of the semiconductor device built by the semiconductor device manufacturing method according to the second embodiment.

FIG. 7A shows a simplified process flowchart of the manufacturing method for the semiconductor device according to this embodiment. This semiconductor device manufacturing method uses a substrate which has a single-crystal semiconductor layer at least in a surface layer. A plurality of circuit blocks made up of circuits which contain metal oxide semiconductor (MOS) transistors are formed in the single-crystal semiconductor layer.

Using this substrate, in a circuit forming process in Step 11, circuit blocks and evaluation circuit sections are formed in the single-crystal semiconductor layer of the surface layer, where the evaluation circuit sections are placed adjacent to predetermined ones of the circuit blocks and contain MOS transistors of the same configuration as the MOS transistors of the circuit blocks. Next, in an inspection process in Step 12, electrical characteristic values of the MOS transistors formed in the evaluation circuit section are checked and in a comparison process in Step 13, the electrical characteristic values of the MOS transistors are compared with a preset design value.

In the comparison process in Step 13, the design values and electrical characteristic values are compared and a numeric value of the difference is determined and set as a numerical target value by which the mobility should be increased. The mobility and electrical characteristics are associated by Eq. (A) below.

$$1/\rho = nq\mu \qquad \text{Eq. (A)}$$

where $\rho$ is resistivity ($\Omega \cdot$cm), n is carrier density (cm$^{-3}$), q is elementary charge, and $\mu$ is the mobility (m$^2$/V·s).

In this way, the electrical characteristics of the evaluation circuit section are checked and the value by which the mobility of the adjacent circuit block should be increased is defined as the numerical target value. Then, in a numerical target setting process in Step 14, it is determined what bumps should be placed and under what conditions to impose stresses on the MOS transistors. That is, the values of the stresses to be imposed on the MOS transistors are set variably by changing bump forming conditions such as shape, material, placement locations, or manufacturing conditions of the bumps according to the numerical target value. Incidentally, if the values of the stresses to be imposed on the MOS transistors and the bump forming conditions are determined in advance, the numerical target setting process may be omitted.

If it is determined in the inspection of the electrical characteristics of the evaluation circuit section that the electrical characteristic values of the MOS transistors are smaller than the design values, in a bump forming process in Step 15, a plurality of bumps are formed on the circuit block which is adjacent to the evaluation circuit section and made up of the MOS transistors, at least via a protective insulating film, where the bumps are formed in such locations of the circuit block that the stresses needed to achieve the numerical target value of the mobility can be imposed. In this way, by forming the bumps in such locations as to improve the electrical characteristics of the MOS transistors determined to be in need of improvement in electrical characteristics based on the electrical characteristic measurements of the evaluation circuit section, it is possible to impose stresses on the MOS transistors and thereby increase their mobility, allowing their electrical characteristic values to reach the design values.

Furthermore, the substrate on which the semiconductor device has been formed is sealed in a package using resin, as required, in a sealing process in Step 16 in order to fix or increase the stresses imposed on the bumps.

The manufacturing method represented by the simplified process flowchart described with reference to FIG. 7A produces a semiconductor device 100 whose configuration is outlined in FIG. 7B.

Referring to FIG. 7B, a plurality of circuit blocks are formed on a chip surface 21 of the semiconductor device 100 such as a system LSI. Main circuit blocks include a memory section 24, an MPU (microprocessor unit) section 25, an input/output control (hereinafter referred to as an IOC) section 26, a programmable logic functional section 27, an input/output circuit section 28, and other circuit sections 29. Evaluation circuit sections 19 are formed in a single-crystal semiconductor layer (not shown) of the semiconductor chip substrate 30, where the evaluation circuit sections are placed adjacent to predetermined ones of the circuit blocks and contain MOS transistors of the same configuration as the MOS transistors of the circuit blocks.

Incidentally, the circuit blocks on the semiconductor chip substrate 30 include circuit blocks containing at least a metal oxide semiconductor (MOS) transistor. In FIG. 7B, a plurality of bumps 23 are placed on each of the circuit blocks, i.e., on the memory section 24, IOC section 26, programmable logic functional section 27, and input/output circuit section 28. A plurality of bumps 23 are similarly placed on each of the evaluation circuit sections 19 adjacent to the circuit blocks. As the plurality of bumps 23 are placed on the circuit blocks, compression stresses applied downward from the gate electrode direction and tensile stresses applied along the source-drain direction are imposed on the channel layers of the MOS transistors, e.g., the n-type MOS transistors, in this case, in the circuit blocks.

It is believed that the compression stresses are caused by bonding loads imposed during placement of the bumps 23, weight of the bumps 23, and the like. On the other hand, it is believed that the tensile stresses are caused by contraction of the bumps 23 which occurs when the bumps 23 installed at higher temperatures than the protective film cool subsequently. Consequently, the bumps 23 pull the protective film right under them toward themselves, applying tensile stresses along the source-drain direction on the channel layers of the n-type MOS transistors. The application of the compression stresses in the channel layer direction from the bumps and the tensile stresses along the source-drain direction from the channel layers increases the mobility of the carriers moving in the channel layers, allowing the n-type MOS transistors to operate at high speed, at high current, or with low current consumption and thereby improving/increasing the performance of the semiconductor device 100.

Next, as an example, main components of the semiconductor device 100 produced by the manufacturing method according to this embodiment will be described with reference to the schematic sectional view in FIG. 8. FIG. 8 is a schematic sectional view taken along line C-C in FIG. 7B, showing that area of the semiconductor device 100 which contains bumps 23 encircled by a broken line 22. Besides, a schematic sectional view taken along line D-D in FIG. 7B and showing that area of the semiconductor device 100 which contains bumps 23 encircled by a broken line 22 also has the structure shown in FIG. 8.

Figure 8:
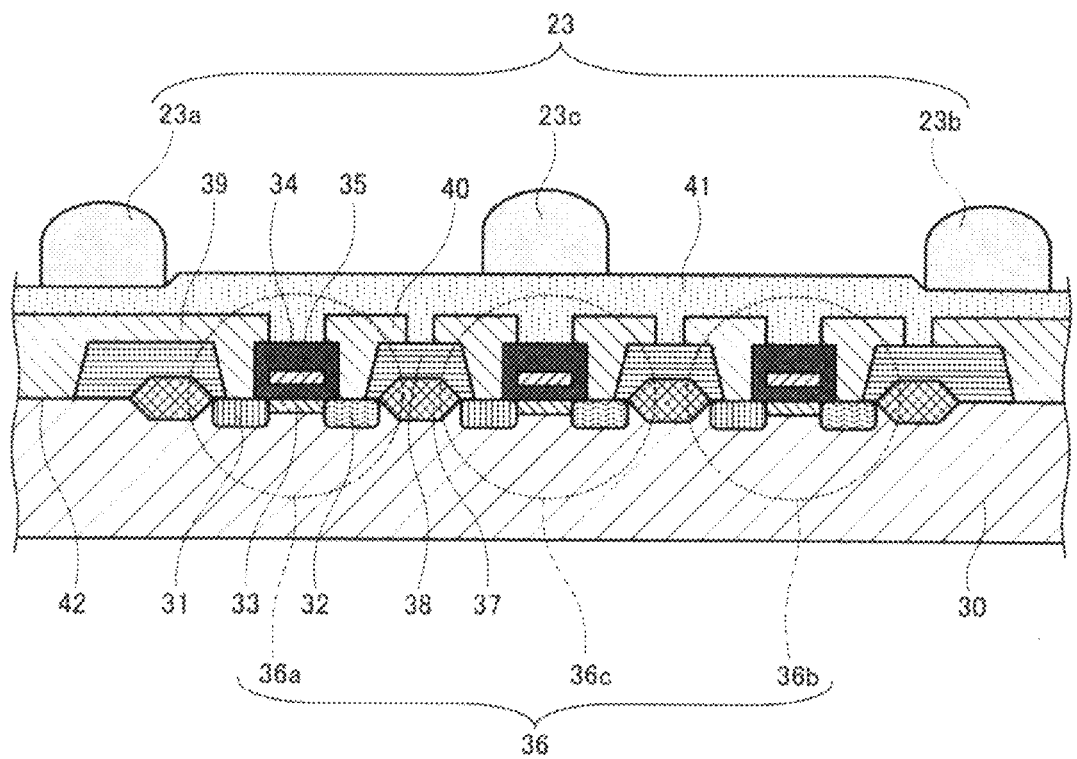
FIG. 8 is a sectional view showing a configuration of the semiconductor device according to the second embodiment.
Figure 9A:
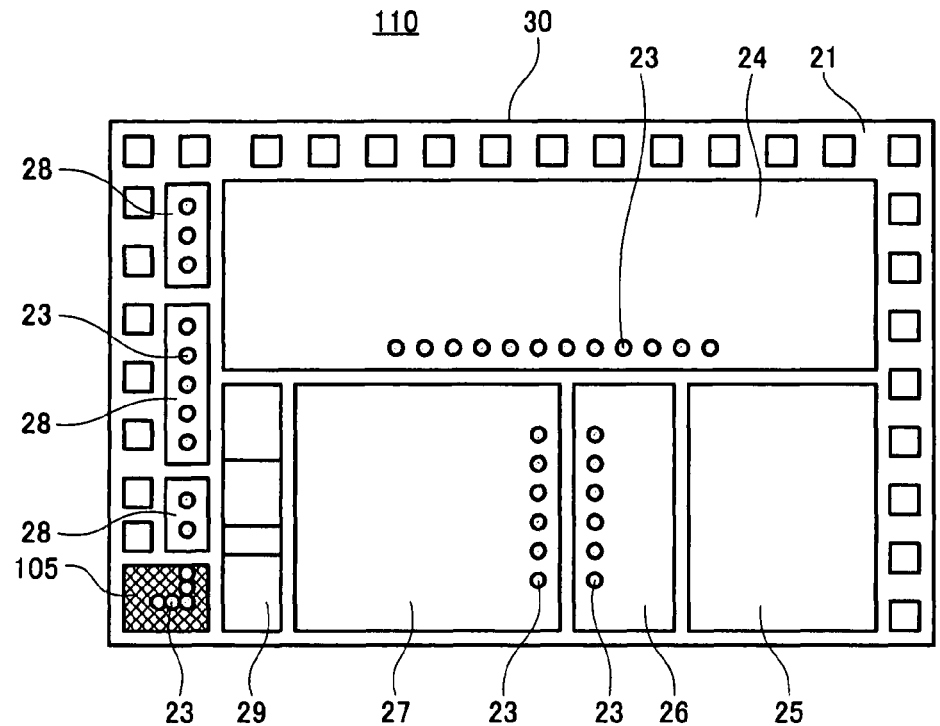
FIG. 9A is a diagram exemplifying a formation position of an evaluation circuit section according to the second embodiment.
Figure 9B:
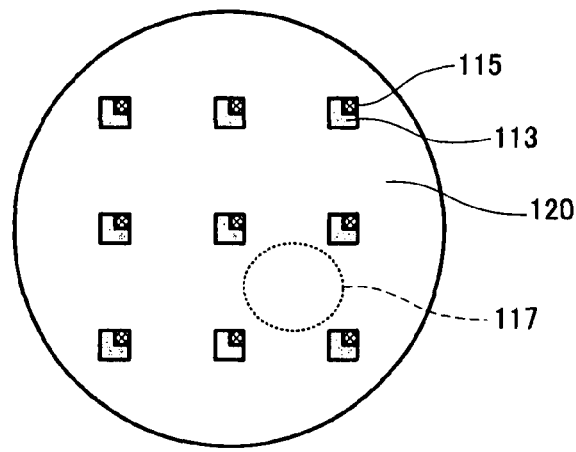
FIG. 9B is a diagram exemplifying the formation position of the evaluation circuit section according to the second embodiment.
Figure 9C:
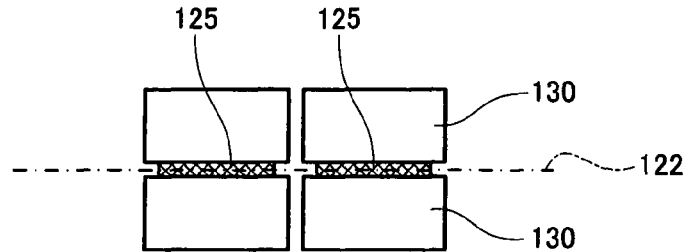
FIG. 9C is a diagram exemplifying the formation position of the evaluation circuit section according to the second embodiment.

According to the schematic sectional view in FIG. 8, source regions 31 and drain regions 32 which exhibit n-type conductivity are formed on and around the surface of the semiconductor chip substrate 30 which exhibits p-type conductivity. Besides, n-type channel layers 33 are formed in those areas on and around the surface of the semiconductor chip substrate 30 which are located between the source regions 31 and drain regions 32. Current flowing through the n-type channel layers 33 is controlled by a voltage applied to gate electrodes 35 via an oxide film 34. In FIG. 8, three n-type MOS transistors 36 of such a configuration are arranged in parallel: an n-type MOS transistor 36a, n-type MOS transistor 36b, and n-type MOS transistor 36c. The n-type MOS transistors 36 are isolated from adjacent ones by an oxide film 37. Furthermore, the surface of the semiconductor chip substrate 30 is covered with a protective oxide film 38, and source electrodes 39 and drain electrodes 40 are formed in the source regions 31 and drain regions 32, respectively. Incidentally, the source electrodes 39 are grounded by being connected electrically to part 42 of the surface of the semiconductor chip substrate 30.

Top of the circuit which contains the n-type MOS transistors 36 formed in this way is covered with a protective film 41, and bumps 23a and 23b are placed in areas adjacent to the n-type MOS transistors 36a and 36b, respectively, on the protective film 41. Incidentally, the protective film 41 is left in a room-temperature environment without being heated or cooled. Again, since the bumps 23a and 23b are installed at temperatures higher than room temperature, they contract when they cool to the room temperature. That is, by placing the bumps 23a and 23b in areas obliquely above the source regions 31 and/or drain regions 32 of the n-type MOS transistors 36 and pulling the protective film 41 to left and right from above, it is possible to apply tensile stresses along the source-drain direction of the n-type MOS transistors 36a and 36b.

This is because material of the bumps 23 has a higher coefficient of thermal expansion than material of the protective film 41 and after the bumps 23 are placed on the protective film 41 at higher temperatures than the protective film 41, the bumps 23 are cooled as their heat escapes from the protective film 41, imposing tensile stresses on the protective film 41. For example, if the bumps 23 are made of metal material such as Al and the protective film 41 is made of an oxide film such as $SiO_2$ or nitride film such as $Si_3N_4$, since the metal material has higher coefficient of thermal expansion than the oxide or nitride film, the tensile stresses are imposed as described above. Incidentally, the bumps 23 are preheated before being placed on the protective film 41. Then, they are placed on the semiconductor substrate 30 prepared at room temperature.

Also, a bump 23c is placed on the channel layer 33 of the n-type MOS transistor 36c via the protective film 41 to impose compression stresses on the n-type MOS transistor 36c from above. Thus, by imposing compression stresses toward the channel layers 33, and tensile stresses along the source-drain direction of the n-type MOS transistors 36, from the gate electrodes 35 above the channel layers 33 of the n-type MOS transistors 36 in such a way as to satisfy target values of electrical characteristics, it is possible to increase the mobility of the carriers moving in the channel layers 33, allowing the n-type MOS transistors 36 in need of improvement in electrical characteristics to operate at high speed, at high current, or with low current consumption and thereby improving the performance of the semiconductor device 100.

FIGS. 9A to 9C show a simplified configuration example of a semiconductor device which has evaluation circuit sections of a configuration different from that of the semiconductor device illustrated in FIG. 7B and produced by the manufacturing method represented by the simplified process flowchart described with reference to FIG. 7A.

FIG. 9A shows a semiconductor device 110 in which an evaluation circuit section 105 is concentrated in a lower left corner of the semiconductor chip substrate 30. Whereas in FIG. 7B, evaluation circuit sections are built in a scattered manner, in FIG. 9A, the evaluation circuit section 105 is built, being concentrated in one location. This expands an area available to each circuit block and makes layout on the chip surface 21 easier as well as increases packing density of the semiconductor device 110 formed on the semiconductor chip substrate 30 and makes performance enhancement easier. Since it is considered that there are no significant variations in manufacturing conditions within a chip, by concentrating the evaluation circuit section 105 in a single location, forming bumps 23 on it, and measuring changes in characteristics before and after the bump formation, it is possible to control the changes in the characteristics of each circuit block. Of course, if layout or space on the chip surface 21 allows, the evaluation circuit section 105 may be formed in multiple locations to measure changes in the characteristics more accurately and thereby control the changes in the characteristics of each circuit block.

FIG. 9B shows an example in which an evaluation circuit section 115 is incorporated into a process control section 113 of a semiconductor wafer 120. The process control section 113 plays the role of evaluating whether the semiconductor wafer has acquired desired characteristics as the semiconductor wafer steps through manufacturing processes in which resistors, transistors, and other basic circuits are formed gradually. Semiconductor chips (not shown) are lined up thickly all over the semiconductor wafer 120 except for the area where the evaluation circuit section 115 is formed. For example, semiconductor chips (not shown) are also lined up thickly all over an area 117 encircled by a broken line. In the embodiment of the present invention, by forming the evaluation circuit section 115 in part of the process control section 113, forming bumps (not shown) in the area of the evaluation circuit section 115, and measuring changes in characteristics before and after the bump formation, it is also possible to control the changes in the characteristics of each circuit block. Incidentally, the evaluation circuit section 115 may be formed in an area around the semiconductor wafer 120.

Furthermore, as shown in FIG. 9C, evaluation circuit sections 125 may be formed between semiconductor devices 130 formed on a semiconductor wafer. Semiconductor devices 130 formed on a semiconductor wafer and yet to be cut off are lined up all over an area 117 in FIG. 9B, for example, as shown in FIG. 9C. By forming the evaluation circuit sections 125 between the semiconductor devices 130 in this way, it is possible to place the evaluation circuit sections 125 next to the semiconductor devices 130 desired to be monitored and controlled and in those parts of the semiconductor wafer which are not used after the semiconductor devices 130 are cut off and thereby make effective use of the semiconductor wafer as well as to obtain a large number of semiconductor devices 130 from the single semiconductor wafer. Consequently, since the evaluation circuit sections 125 are formed only on split lines 122 which are to serve as scribe lines for the adjacent semiconductor devices 130 without forming the evaluation circuit sections 125 in the semiconductor devices 130, it is possible to make effective use of the semiconductor wafer.

In this way, in the circuit forming process of the simplified process flowchart, all or part of the evaluation circuit sections may be formed outside the areas of the semiconductor devices provided as semiconductor chips on the substrate.

Third Embodiment

A third embodiment of the present invention will be described with reference to FIGS. 10 and 11.

Figure 10A:
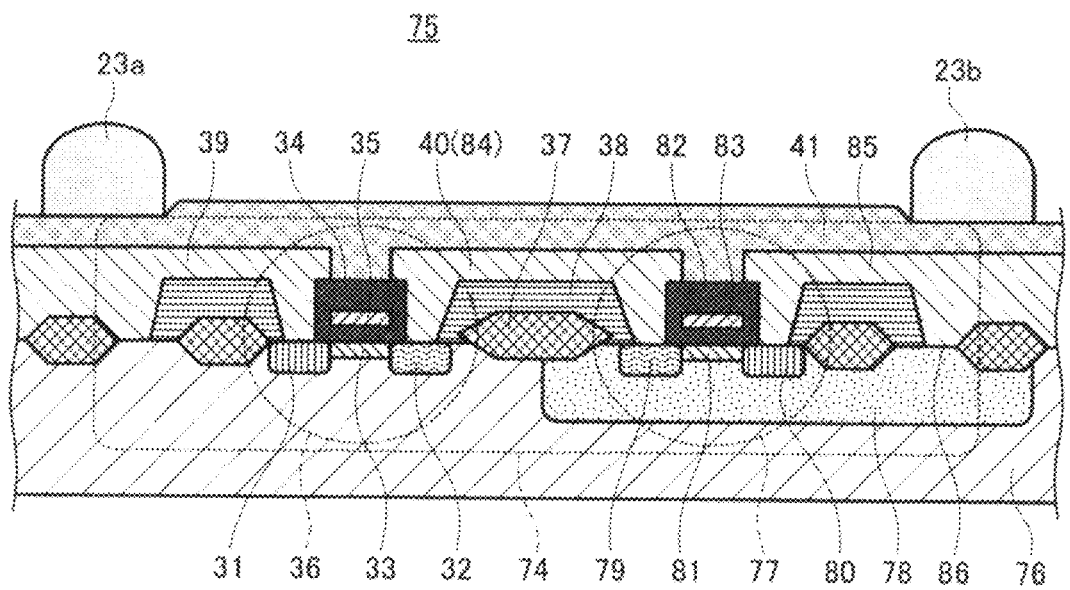
FIG. 10A is a sectional view showing a configuration of a semiconductor device according to a third embodiment.
Figure 10B:
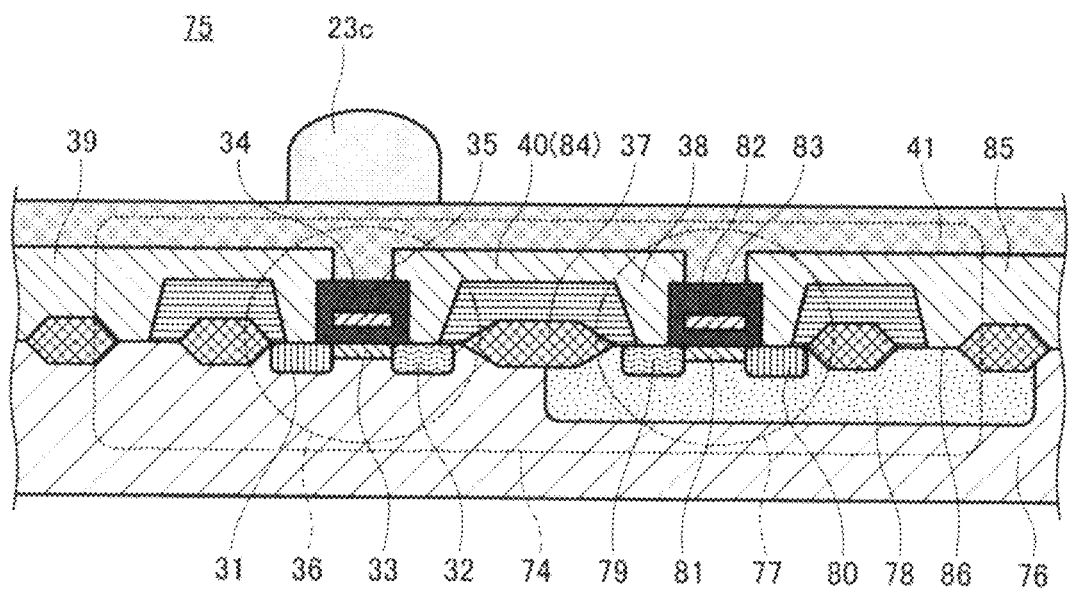
FIG. 10B is a sectional view showing the configuration of the semiconductor device according to the third embodiment.
Figure 11A:
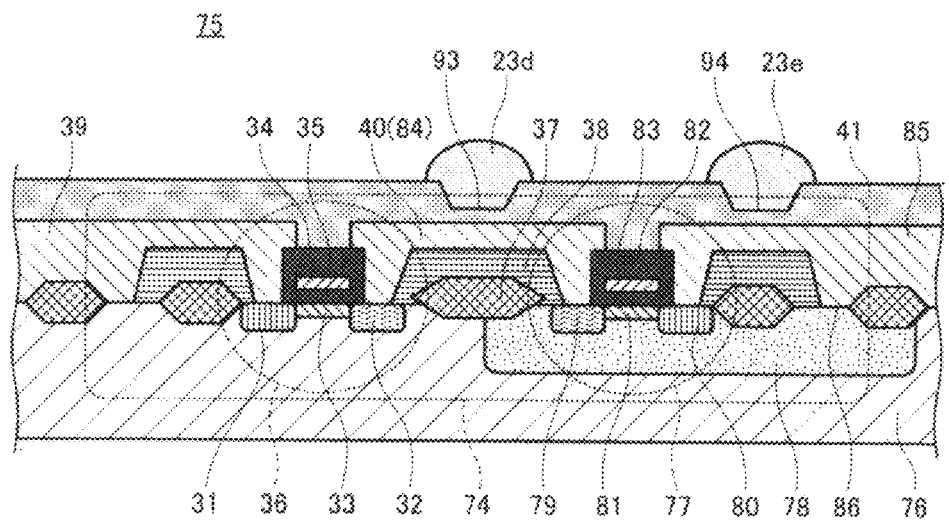
FIG. 11A is a diagram illustrating a structure of bumps used to apply compression stresses along a source-drain direction of the semiconductor device according to the third embodiment.
Figure 11B:
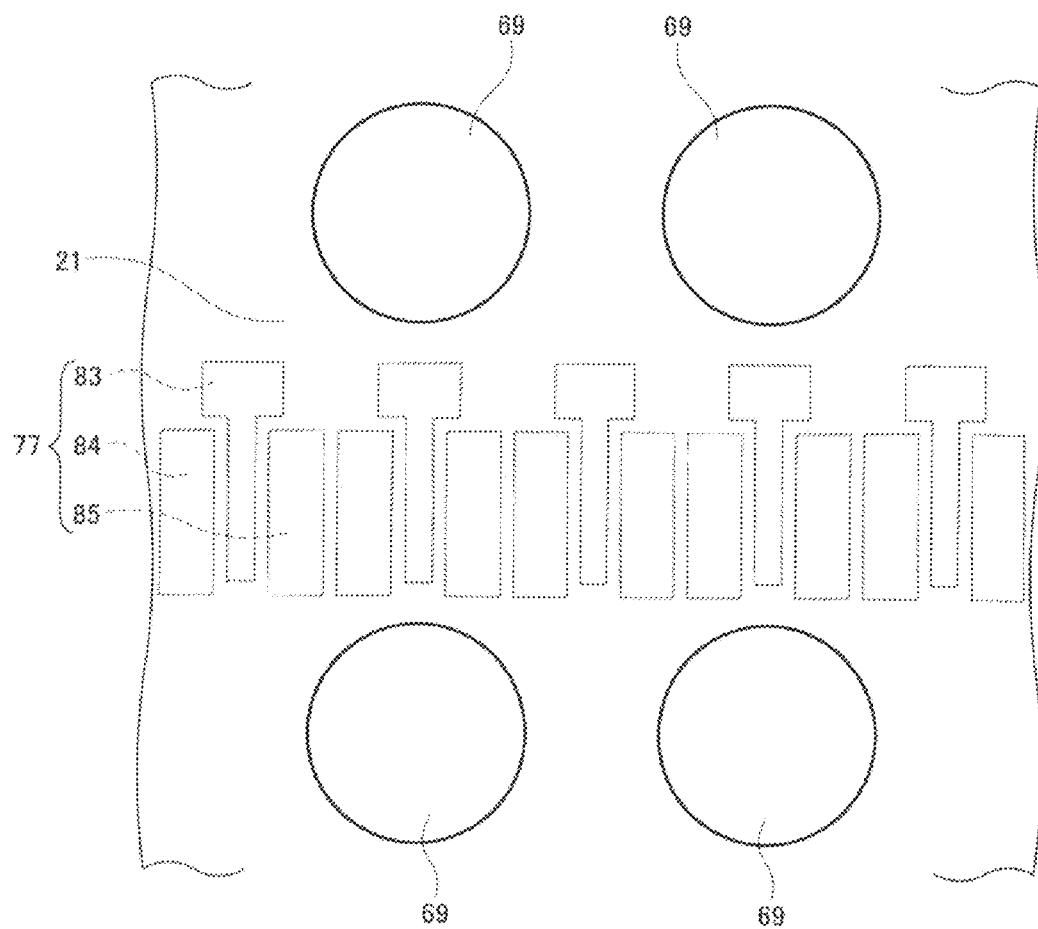
FIG. 11B is a diagram illustrating the structure of the bumps used to apply compression stresses along the source-drain direction of the semiconductor device according to the third embodiment.

FIGS. 10A and 10B are sectional views showing a configuration of a semiconductor device according to a third embodiment. FIGS. 11A and 11B are diagrams illustrating a structure of bumps used to apply compression stresses along a source-drain direction of the semiconductor device according to the third embodiment.

The semiconductor device according to this embodiment contains CMOS transistors instead of the n-type MOS transistors described in the first embodiment. That is, a semiconductor device 75 is made up of circuit blocks which contain CMOS transistors.

Referring to FIG. 10A, for example, a source region 31 and drain region 32 which exhibit n-type conductivity are formed on and around the surface of a semiconductor chip substrate 76 which exhibits p-type conductivity. Besides, an n-type channel layer 33 is formed in that area on and around the surface of the semiconductor chip substrate 76 which is located between the source region 31 and drain region 32. Current flowing through the n-type channel layer 33 of the n-type MOS transistor 36 is controlled by a voltage applied to a gate electrode 35 via an oxide film 34.

On the other hand, a p-type MOS transistor 77 is formed in isolation from the n-type MOS transistor 36 via an oxide film 37 to compose a CMOS transistor 74. In the p-type MOS transistor 77, a source region 79 and drain region 80 which exhibit p-type conductivity are formed on an n-type diffused layer 78, which in turn is formed on the semiconductor chip substrate 76. Besides, a p-type channel layer 81 is formed in that area on and around the surface of the n-type diffused layer 78 which is located between the source region 79 and drain region 80. Current flowing through the p-type channel layer 81 of the p-type MOS transistor 77 is controlled by a voltage applied to a gate electrode 83 via an oxide film 82.

Furthermore, the surfaces of the semiconductor chip substrate 76 and n-type diffused layer 78 are covered with a protective oxide film 38, and a source electrode 39 and drain electrode 40 are formed in the source region 31 and drain region 32 of the n-type MOS transistor 36, respectively. Similarly, a source electrode 84 and drain electrode 85 are formed in the source region 79 and drain region 80 of the p-type MOS transistor 77, respectively. Incidentally, the drain electrode 40 of the n-type MOS transistor 36 and source electrode 84 of the p-type MOS transistor 77 are formed as a common electrode. Besides, the drain electrode 85 is connected to the n-type diffused layer 78 via well contact 86, and thereby connected to a supply voltage (not shown) Vdd.

In this way, the CMOS transistor 74 can be manufactured according to the simplified process flowchart shown in FIG. 7A as is the case with the n-type MOS transistors. Thus, a circuit block made up of the p-type MOS transistor 77 and CMOS transistor 74 as well as an evaluation circuit section adjacent to them can be manufactured according to the simplified process flowchart shown in FIG. 7A. They can be manufactured by simply forming the n-type diffused layer, source region, and drain region for the p-type MOS transistor 77 in the circuit forming process in Step 11 and adding an oxide film formation process for device isolation and a wiring process.

The circuit containing the n-type MOS transistor 36 and p-type MOS transistor 77 formed in this way is covered with the protective film 41 from above and a plurality of bumps 23a and 23b are placed on top of the protective film 41 to apply stresses on the n-type channel layer 33 of the n-type MOS transistor 36. The locations of the bumps are the same as in the first embodiment. For example, the bumps 23a and 23b are placed on opposite sides of the n-type MOS transistor 36 at high temperatures, and tensile stresses are applied along the source-drain direction using the difference in the coefficient of thermal expansion when the bumps 23a and 23b cool.

The semiconductor device 75 in FIG. 10B has the same configuration as that in FIG. 10A except that they differ in bump forming position. Specifically, in FIG. 10B, a bump 23c is formed on the channel layer 33 of the n-type MOS transistor 36 via the protective film 41 to apply compression stresses vertically on the channel layer 33 from above.

On the other hand, FIG. 11A shows an example in which compression stresses are applied along the source-drain direction of the p-type MOS transistor 77 and FIG. 11B shows an example of a semiconductor device in which tensile stresses are applied in a direction orthogonal to the source-drain direction of the p-type MOS transistor 77.

Referring to FIG. 11A, recesses 93 and 94 are provided on opposite sides of the p-type MOS transistor 77 and bumps 23d and 23e are placed in the recesses 93 and 94. Compression stresses are applied by the bumps 23d and 23e on slopes of the recesses 93 and 94. Consequently, compression stresses are applied along the source-drain direction of the p-type MOS transistor 77.

In FIG. 11B, a plurality of bumps 69 are placed on opposite sides of p-type MOS transistors 77 in a direction orthogonal to the source-drain direction of the p-type MOS transistors 77. The plurality of bumps 69 are placed on opposite sides of the p-type MOS transistors 77 at high temperatures, and tensile stresses are applied along the source-drain direction using the difference in the coefficient of thermal expansion when the bumps 69 cool.

Incidentally, the crystal axis direction which effectively increases the mobility when stresses are imposed on the channel layers of the p-type MOS transistors 77 differs from that of the n-type MOS transistors.

By relating the resistivity ρ and the mobility μ of the electrons, which are carriers in the n-type MOS transistor according to the first embodiment in FIGS. 5A and 5B, to each other and expanding a resulting formula, we obtain:

$$\frac{\Delta \mu}{\mu} = -\frac{\Delta \rho}{\rho} = \qquad \text{[Formula 4]}$$
$$1.02 \times 10^{-9} \sigma_{11} - 5.34 \times 10^{-10} \sigma_{22} - 5.34 \times 10^{-10} \sigma_{33}$$

$$\frac{\Delta \mu}{\mu} = \qquad \text{[Formula 6]}$$
$$-\frac{\Delta \rho}{\rho} = 3.1 \times 10^{-10} \sigma_{11} + 1.8 \times 10^{-11} \sigma_{22} - 5.3 \times 10^{-10} \sigma_{33}$$

On the other hand, in the case of a p-type MOS transistor which has the structure shown in FIG. 5A and whose source-drain direction coincides with the [100] direction of the crystal axis, the relationship between the resistivity ρ and the mobility μ of holes which are carriers is given by:

$$\frac{\Delta \mu}{\mu} = \qquad \text{[Formula 7]}$$
$$-\frac{\Delta \rho}{\rho} = -6.6 \times 10^{-11} \sigma_{11} + 1.1 \times 10^{-11} \sigma_{22} + 1.1 \times 10^{-11} \sigma_{33}$$

Also, in the case of a p-type MOS transistor which has the structure shown in FIG. 5A and whose source-drain direction coincides with the [110] direction of the crystal axis, the relationship between the resistivity ρ and the mobility μ of holes which are carriers is given by:

$$\frac{\Delta \mu}{\mu} = \qquad \text{[Formula 8]}$$
$$-\frac{\Delta \rho}{\rho} = -7.2 \times 10^{-10} \sigma_{11} + 6.6 \times 10^{-10} \sigma_{22} + 1.1 \times 10^{-11} \sigma_{33}$$

Considering the above circumstances, let us look at Formulas 7 and 8 in terms of changes in the mobility of p-type MOS transistors when stresses are applied. We can see that Formula 7 corresponds to the [100] coordinate system while Formula 8 corresponds to the [110] coordinate system. With the p-type MOS transistors, in the [100] coordinate system, the mobility is almost constant regardless of in what direction stresses are applied.

On the other hand, in the [110] coordinate system, it can be seen that the mobility changes notably when compression stresses are applied along the source-drain direction and tensile stresses are applied in a direction orthogonal to the source-drain direction.

In this way, by forming bumps in such a way as to apply compression stresses along the source-drain direction and tensile stresses in a direction orthogonal to the source-drain direction on the p-type MOS transistor in the [110] coordinate system formed on the CMOS transistor and the like, it is possible to increase the mobility of the carriers in the channel layer of the p-type MOS transistor, improve performance, and increase the speed of the CMOS transistor. This makes it possible to enhance the performance of a semiconductor device which has circuits or circuit blocks containing CMOS transistors. Also, this embodiment is as effective as the above embodiments in increasing the mobility of the carriers in n-type MOS transistors.

Fourth Embodiment

A fourth embodiment of the present invention will be described with reference to FIGS. 12 and 13.

Figure 12:
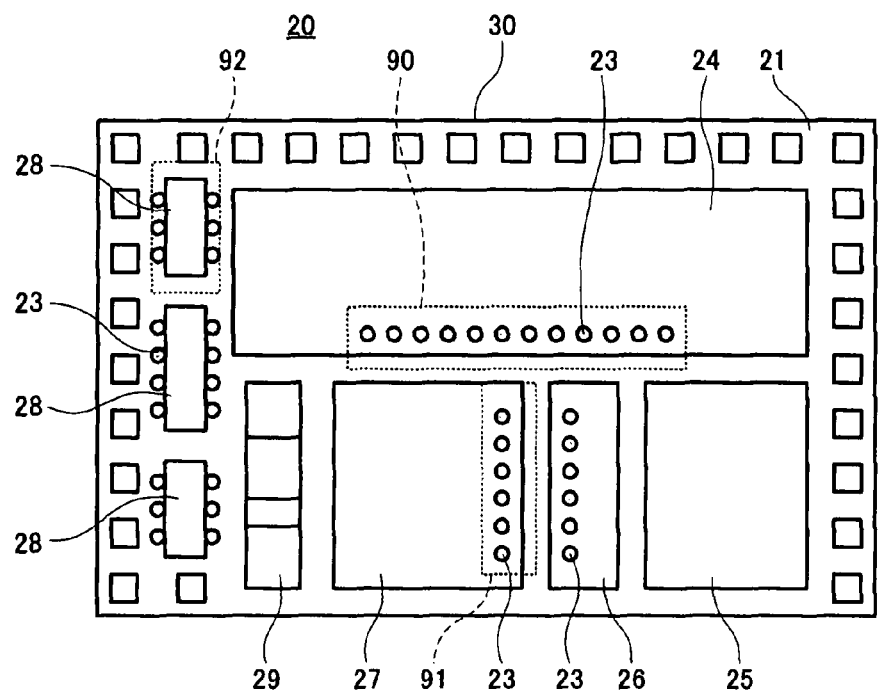
FIG. 12 is a diagram showing a configuration of a semiconductor device according to a fourth embodiment, where bumps are arranged in a line.
Figure 13:
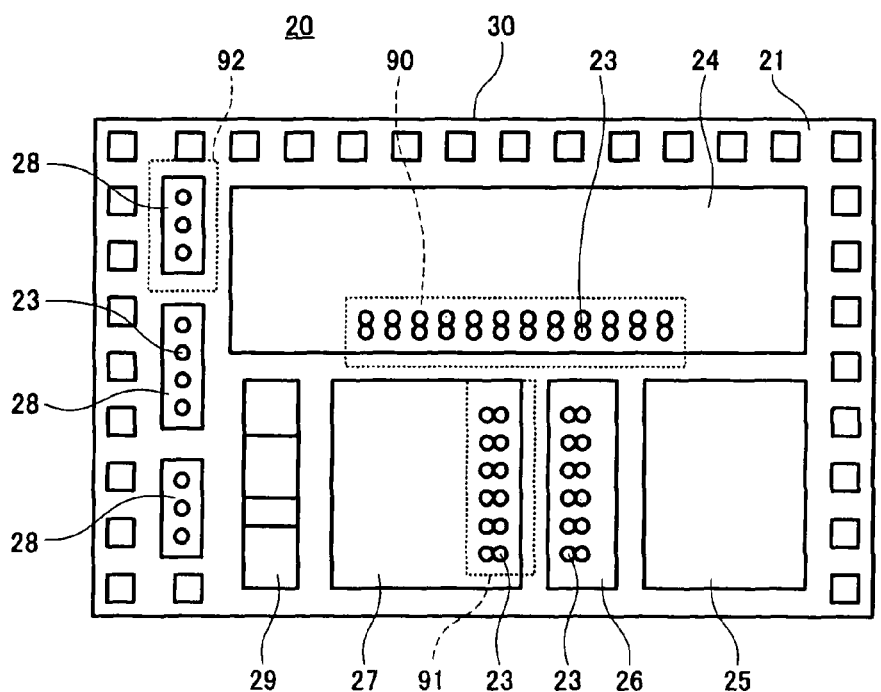
FIG. 13 is a diagram showing a configuration of the semiconductor device according to the fourth embodiment, where bumps are arranged in two lines.
Figure 14:
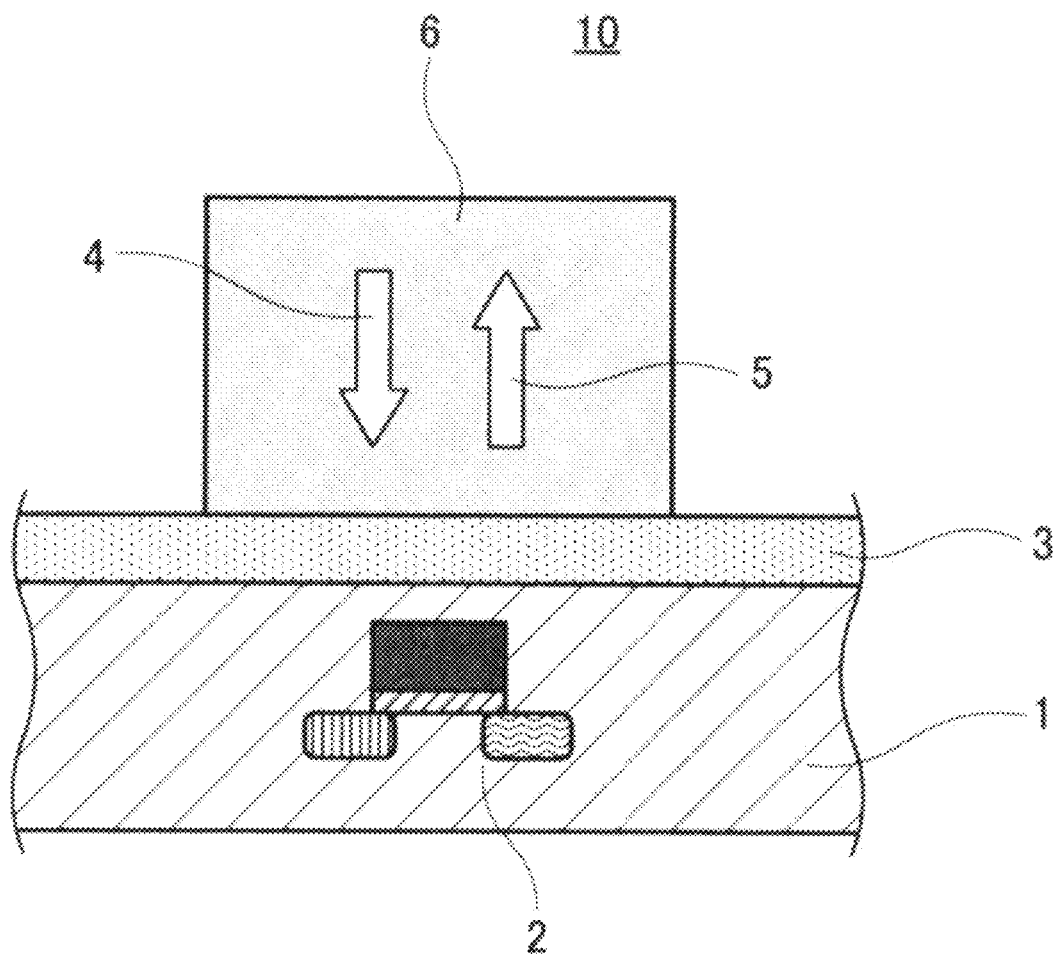
FIG. 14 is a schematic sectional view showing a configuration of a conventional semiconductor device.

FIG. 12 is a diagram showing a configuration of a semiconductor device according to a fourth embodiment, where bumps are arranged in a line and FIG. 13 is a diagram showing a configuration of the semiconductor device according to the fourth embodiment, where bumps are arranged in two lines.

FIGS. 12 and 13 show various layouts of bumps mounted on circuit blocks.

FIG. 12 shows a semiconductor device 20 which functions, for example, as a system LSI as in the case of the semiconductor device according to the first embodiment in FIG. 7B. A plurality of circuit blocks are arranged similarly on a chip surface 21 in FIG. 12. Individual circuit blocks are the same as in FIG. 7B, and thus a description thereof will be omitted to avoid redundancy. Incidentally, evaluation circuit sections are placed adjacent to the circuit blocks in FIGS. 12 and 13, but they are not shown in the figures.

Of the circuit blocks, the memory section 24 has n-type MOS transistors (not shown) of its input/output circuit section arranged in parallel along the source-drain direction. Bumps 23 are arranged in a line along the source-drain direction in an area 90, covering the top of gate channel layers to apply compression stresses on the channel layers. Similarly, bumps 23 are arranged in a line in the circuit blocks of an IOC section 26 and programmable logic functional section 27 as shown, for example, in an area 91 to impose compression stresses on the channel layers of the n-type MOS transistors placed in this area.

Furthermore, in an area 92 near the circuit block of an input/output circuit section 28 in this system LSI, bumps 23 are arranged on opposite sides of the circuit block to apply tensile stresses on the channel layers of the n-type MOS transistors in the input/output circuit section 28 along the source-drain direction.

In FIG. 13, bumps are arranged in multiple lines to apply stresses, as opposed to FIG. 12. In an area 90, bumps 23 are drawn up in two lines to apply compression stresses on channel layers. Also, in an area 91, bumps are drawn up in two lines to apply compression stresses. The bumps are drawn up in two lines in this way to increase the magnitude of the applied compression stresses and thereby increase the effect of the compression stresses on the performance improvement of the n-type MOS transistors. Also, in the input/output circuit section 28 in the area 92, the bumps 23 are placed vertically above the channel layers of the n-type MOS transistors to apply compression stresses.

In this way, by placing bumps above or near each circuit block of the semiconductor device, compression stresses are imposed from the gate electrode direction vertically above the circuit, tensile stresses are imposed along the source-drain direction, or compression stresses are imposed in a direction orthogonal to the source-drain direction, on the n-type MOS transistors in the circuit block to improve the performance of the n-type MOS transistors and thereby improve the performance of the semiconductor device. Although n-type MOS transistors have been described here, bumps can similarly be mounted on p-type MOS transistors and CMOS transistors to improve the performance of the MOS transistors and circuit blocks.

Incidentally, although in the configurations described above, the evaluation circuit sections are mounted in the semiconductor chip, the evaluation circuit sections may be placed in a semiconductor wafer process evaluation part outside the semiconductor chip or on scribe lines between semiconductor chips to increase the number of chips available from a semiconductor wafer.

Furthermore, the semiconductor device described in any of the first to fourth embodiments is mounted face down using connection bumps and sealed by resin. This makes it possible to fix or increase the stresses imposed by bumps on the semiconductor device according to the embodiment, and thereby reliably improve the performance of the semiconductor device or increase the effect of the compression stresses.

Incidentally, although it is assumed in the embodiments of the present invention that the channel layer is a general crystal layer, a distorted crystal layer which contains distortions or an interface of compound semiconductor may be used as the channel layer. Furthermore, a layer, such as a quantum well layer or heterojunction interface, which allows higher mobility due to quantum effects may be used as the channel layer.

Also, the material of the semiconductor substrate may be not only a compound semiconductor such as Si or GaAs, but also an insulating substrate such as glass.

Also, although the material of bumps may, of course, be a metal such as Al, Cu, or Au, any material that can be placed on the protective film of the semiconductor and used to apply compression stresses or that has a higher coefficient of thermal expansion than the protective film of the semiconductor can offer similar effects.

What is claimed is:

1. A semiconductor device that has a substrate which contains a single-crystal semiconductor layer at least in a surface layer, and a plurality of circuit blocks constructed in said single-crystal semiconductor layer and made up of circuits containing MOS transistors, said semiconductor device comprising:

a protective film formed on entire top surfaces of said circuit blocks formed in said single-crystal semiconductor layer; and at least one bump formed on each of appropriate ones of said circuit blocks via said protective film, wherein said bump is formed in a position to apply to the MOS transistors stresses which will increase carrier mobility of said MOS transistors which need improvement in electrical characteristics.

2. The semiconductor device according to claim 1, wherein said MOS transistors are n-type MOS transistors.

3. The semiconductor device according to claim 1, wherein said MOS transistors are p-type MOS transistors.

4. The semiconductor device according to claim 1, wherein said MOS transistors have a CMOS structure.

5. The semiconductor device according to claim 2, wherein said single-crystal semiconductor layer is made of a silicon single crystal; and a direction of a current flowing through channel layers of said n-type MOS transistors is one of [100] and [010] directions of said silicon single crystal.

6. The semiconductor device according to claim 2, wherein said single-crystal semiconductor layer is made of a silicon single crystal; and a direction of a current flowing through channel layers of said n-type MOS transistors is one of [110] and [−110] directions of said silicon single crystal.

7. The semiconductor device according to claim 3, wherein said single-crystal semiconductor layer is made of a silicon single crystal; and a direction of a current flowing through channel layers of said p-type MOS transistors is a [110] direction of said silicon single crystal.

8. The semiconductor device according to claim 2, wherein the stresses imposed on channel layers of the n-type MOS transistors from said bump are compression stresses applied from a gate electrode direction.

9. The semiconductor device according to claim 2, wherein the stresses imposed on channel layers of the n-type MOS transistors from said bump are tensile stresses applied along a source-drain direction.

10. The semiconductor device according to claim 2, wherein the stresses imposed on channel layers of the n-type MOS transistors from said bump are compression stresses applied in a direction orthogonal to a source-drain direction.

11. The semiconductor device according to claim 3, wherein the stresses imposed on channel layers of the p-type MOS transistors from. said bump are tensile stresses applied along a source-drain direction.

12. The semiconductor device according to claim 3, wherein the stresses imposed on a channel layer of the p-type MOS transistors from said bump are compression stresses applied in a direction orthogonal to a source-drain direction.

13. The semiconductor device according to claim 9, wherein material of said bump has a higher coefficient of thermal expansion than material of said protective film; and said tensile stresses are imposed as said bump is cooled after being placed on said protective film at a high temperature.

14. The semiconductor device according to claim 11, wherein material of said bump has a higher coefficient of thermal expansion than material of said protective film; and said tensile stresses are imposed as said bump is cooled after being placed on said protective film at a high temperature.

15. The semiconductor device according to claim 1, wherein a recess is provided at a location adjacent to channel layers of said MOS transistors on said protective film and said bump is placed in said recess so that stresses in a compression direction will be imposed on that slope of said recess which is on the side of said channel layers, thereby imposing one of said compression stresses and said tensile stresses.

16. The semiconductor device according to claim 15, wherein at least two bumps are placed as said bump in a direction orthogonal to a source-drain direction and across said channel layers of said MOS transistor to which the stresses are applied.

17. The semiconductor device according to claim 15, wherein at least two bumps are placed as said bump along a source-drain direction and across said channel layers of said MOS transistor to which the stresses are applied.

18. The semiconductor device according to claim 1, wherein said bump is arranged in a straight line in one of a source-drain direction and a direction orthogonal to a source-drain direction of the MOS transistor.

* * * * *